United States Patent
Chen

(10) Patent No.: US 11,588,463 B2
(45) Date of Patent: Feb. 21, 2023

(54) SURFACE ACOUSTIC WAVE DEVICES WITH ULTRA-THIN TRANSDUCERS

(71) Applicant: Zhuohui Chen, Ottawa (CA)

(72) Inventor: Zhuohui Chen, Ottawa (CA)

(73) Assignee: Huawei Technologies Co., Ltd., Shenzhen (CN)

( * ) Notice: Subject to any disclaimer, the term of this patent is extended or adjusted under 35 U.S.C. 154(b) by 83 days.

(21) Appl. No.: 17/031,781

(22) Filed: Sep. 24, 2020

(65) Prior Publication Data
US 2022/0094327 A1 Mar. 24, 2022

(51) Int. Cl.
*H03H 9/02* (2006.01)
*H03H 3/08* (2006.01)
*H03H 9/145* (2006.01)

(52) U.S. Cl.
CPC .......... *H03H 9/02574* (2013.01); *H03H 3/08* (2013.01); *H03H 9/02582* (2013.01); *H03H 9/145* (2013.01)

(58) Field of Classification Search
CPC .......... H01P 1/218; H01P 1/215; H03H 9/02; H03H 9/15; H03H 9/25; H03H 9/64; H03H 9/02574; H03H 3/08; H03H 9/02582; H03H 9/145; H03H 9/02559; H03H 9/14538
USPC ................................ 333/133, 186, 193–196
See application file for complete search history.

(56) References Cited

U.S. PATENT DOCUMENTS

| | | | | |
|---|---|---|---|---|
| 5,235,233 A | * | 8/1993 | Yamamoto | H03H 9/02976 310/313 A |
| 5,965,969 A | * | 10/1999 | Kadota | H03H 9/25 310/313 R |
| 7,471,027 B2 | * | 12/2008 | Kando | H03H 9/02559 310/313 A |
| 10,700,661 B2 | * | 6/2020 | Chen | G10K 11/36 |
| 2003/0137217 A1 | * | 7/2003 | Ishibashi | H03H 9/02582 310/313 R |
| 2018/0219525 A1 | | 8/2018 | Chen | |
| 2019/0288662 A1 | * | 9/2019 | Yang | H03H 9/02559 |

(Continued)

FOREIGN PATENT DOCUMENTS

| | | |
|---|---|---|
| CN | 103954823 | 7/2014 |
| CN | 108988814 A * | 12/2018 |

(Continued)

OTHER PUBLICATIONS

Kimura T. et al. "3.5 GHz longitudinal leaky surface acoustic wave resonator using a multilayered waveguide structure tor high acoustic energy confinement" Japanese Journal of Applied Physics 57, 2018 Jun. 2018.

(Continued)

*Primary Examiner* — Rakesh B Patel
*Assistant Examiner* — Jorge L Salazar, Jr.

(57) ABSTRACT

A surface acoustic wave (SAW) device and methods of making the same are disclosed. The surface acoustic wave device includes a piezoelectric layer coupled to a high acoustic velocity layer at a first surface of the piezoelectric layer. At least one transducer is provided over a second surface of the piezoelectric layer. The at least one transducer comprises a plurality of IDT electrodes that are formed from a substantially two-dimensional (2D) conductive material and configured to propagate a surface acoustic wave having an operating wavelength along the piezoelectric layer.

20 Claims, 33 Drawing Sheets

(56) References Cited

U.S. PATENT DOCUMENTS

2020/0144981 A1* 5/2020 Knapp .............. H03H 9/02866
2021/0265971 A1* 8/2021 Knapp .............. H03H 9/02574

FOREIGN PATENT DOCUMENTS

| CN | 110149102 A | * | 8/2019 | | |
|----|----|----|----|----|----|
| CN | 111316566 | | 6/2020 | | |
| DE | 102018111013 A1 | * | 11/2019 | ......... | H03H 9/02574 |
| JP | 2002094356 A | * | 3/2002 | ......... | H03H 9/02574 |

OTHER PUBLICATIONS

Takai, T. et al. "High-Performance SAW Resonator on New Multilayered Substrate Using LiTaO3 Crystal", IEEE Transactions on Ultrasonics, Ferroelectrics, and Frequency Control, vol. 64, No. 9, Sep. 2017 Sep. 2017.

* cited by examiner

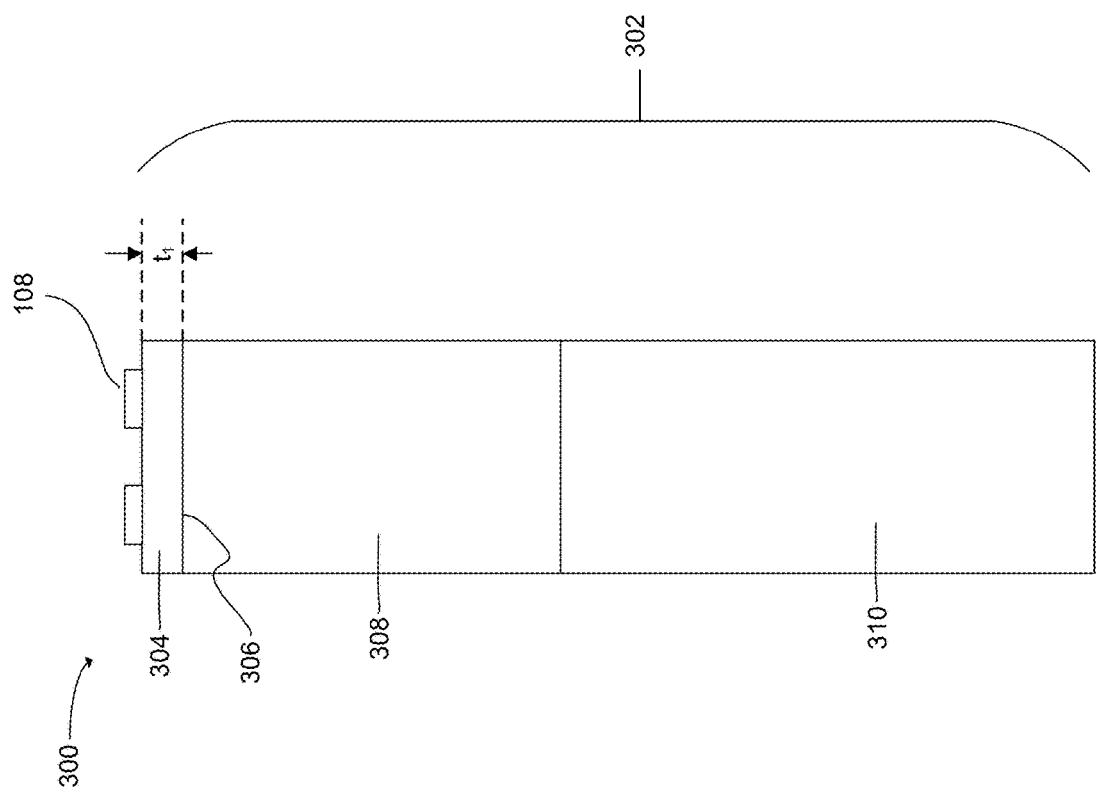

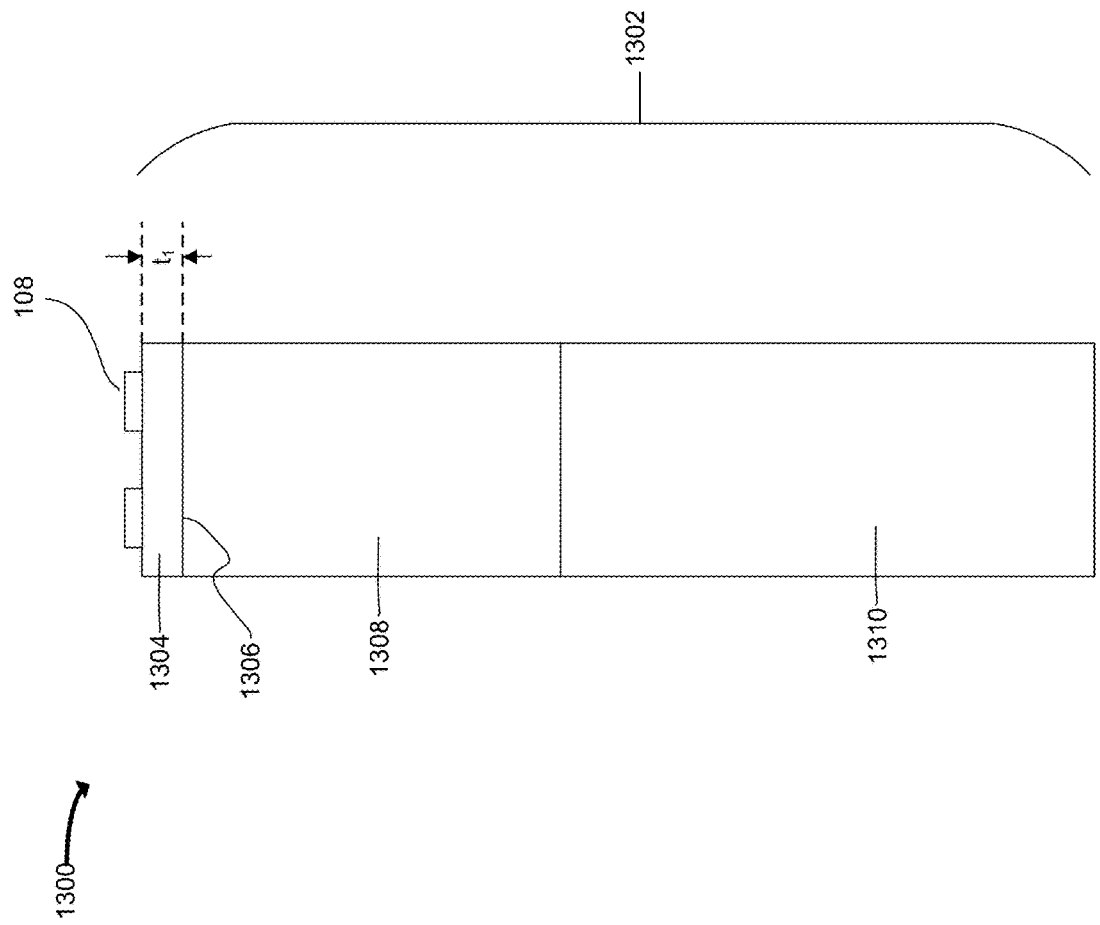

SURFACE ACOUSTIC WAVE DEVICES WITH ULTRA-THIN TRANSDUCERS

TECHNICAL FIELD

The present disclosure relates to surface acoustic wave (SAW) devices, in particular, SAW devices having ultrathin transducers.

BACKGROUND

In communication systems (both terminal and base station infrastructure), surface acoustic wave (SAW) filters and resonators are widely used. For new standards such as the Evolved Universal Mobile Telecommunications System (UMTS) Terrestrial Radio Access (E-UTRA) used in the 5G-TG4-CA, there is growing demand for higher operating frequency, lower insertion loss, higher transmitting power, and/or wider channel bandwidth. New piezoelectric materials or structures are desirable to support the growing demand for higher frequency and wider channel bandwidth. In particular, a high electromechanical coupling coefficient for SAW filters may be desirable.

One of the factors that affect the filter bandwidth is the piezoelectric material's electromechanical coupling coefficient ($k^2$). The higher the electromechanical coupling coefficient, $k^2$, the wider the filter bandwidth may be. Aluminum Nitride (AlN)/diamond multi-layer structures have been suggested and may have a very high acoustic wave velocity of about 9500 m/s at AlN thickness of 0.35 wavelength, $\lambda$. However, the relatively small $k^2$ of 1.2% associated with the AlN/diamond multi-layer structures may be unsuitable for wideband filter and duplexer application.

The applications of SAW filters in most of communication systems require a stable performance, for which a small temperature coefficient of frequency (TCF) of the SAW resonators is required. Various techniques, such as hybrid substrates with wafer bonding technologies, or multi-layer structures with dielectric overlay on interdigital transducers (IDT's) and lithium tantalate ($LiTaO_3$) and lithium niobate ($LiNbO_3$) substrates, were used to reduce the SAW filter temperature coefficients, hence the so called temperature-compensated SAW (TC-SAW).

To further enhance the device quality factor Q of SAW filters, a method is borrowed from solidly mounted resonator—bulk acoustic wave (SMR-BAW); using reflective layers to suppress the leaky SAW in the depth direction, therefore confining the wave energy in the surface of the SAW propagation path, has been implemented in the incredibly high performance SAW (IHP-SAW).

Currently photolithography apparatuses such as krypton-fluoride (KrF) stepper/scanners are used for patterning integrated circuits (IC's) onto wafers. Under the current lithography limitations of the KrF stepper/scanner, incredible high performance (IHP) SAW may be manufactured to operate at as high as 3.5 GHz. For example, Murata™ has manufactured an IHP SAW utilizing shear-horizontal (SH) leaky wave generated on 50° Y-X $LiTaO_3$ wafer-bonded on supporting reflective multi-layer substrate. Such IHP SAW demonstrates SAW phase velocity of about 3800-4200 m/s, and relative bandwidth of 3.4% to 4%. With 0.3 µm IDT electrode width, which can be realized with a krypton-fluoride (KrF) stepper/scanner with a laser wavelength of 248 nm. However, the IHP SAW by Murtata™, even at 3.5 GHz, is insufficient to cover all the bandwidth required in the sub-6G wireless communications.

Another similar structure utilizing longitudinal leaky SAW (LLSAW) on X-cut $LiNbO_3$ wafer-bonded on supporting substrate with reflective multi-layer, demonstrates 1.5 times higher SAW phase velocity of about 5700-6200 m/s compared to that of the above-mentioned IHP SAW. The LLSAW has a relative bandwidth of as high as 9.4% with 0.3 µm IDT electrode width, which can be realized with a KrF stepper/scanner with a laser wavelength of 248 nm. The LLSAW filter can be operated at as high as 5.0 GHz, which still struggles to cover the entire sub-6G wireless communication band.

It would be desirable to be able to further increase the SAW phase velocity, and therefore increase the SAW filter operating frequency sufficient to cover the sub-6G communication band under the same fabrication limitations, while maintaining all the benefits of the above developments (high coupling, high temperature stability, high quality factor, etc.).

SUMMARY

In various examples described herein, a SAW device with multi-layered structures is described.

In some aspects, the present disclosure describes a surface acoustic wave device comprising: a piezoelectric layer having a first surface and an opposing second surface; a high acoustic velocity layer operably coupled to the second surface of the piezoelectric layer; and at least one transducer formed on the first surface of the piezoelectric layer, wherein the at least one transducer comprises a plurality of inter-digital transducer (IDT) electrodes configured to propagate a surface acoustic wave having an operating wavelength ($\lambda$) along the piezoelectric layer, the IDT electrodes being formed from a substantially two-dimensional (2D) conductive material.

In some aspects, the present disclosure describes a method of manufacturing a surface acoustic wave (SAW) device, the method comprising: providing a base layer; providing a high acoustic velocity layer over the base layer; providing a piezoelectric layer over the high acoustic velocity layer; providing at least one transducer of a substantially two-dimensional (2D) conductive material over the piezoelectric layer, the transducer comprising a plurality of inter-digital transducer (IDT) electrodes configured to propagate a surface acoustic wave having an operating wavelength ($\lambda$).

Some of the above aspects may further comprise an equipotential layer of the substantially 2D conductive material coupled between the piezoelectric layer and the high acoustic velocity layer, the equipotential layer defining a short surface between the piezoelectric layer and the high acoustic velocity layer.

In some of the above aspects, the substantially 2D conductive material may be one of monolayer graphene, few-layer graphene, monolayer borophene, and few-layer borophene.

In some of the above aspects, a thickness of the equipotential layer may be approximately $0.0034\lambda$.

In some of the above aspects, the piezoelectric layer may comprise lithium niobate (LN) or lithium tantalite (LT).

In some of the above aspects, the piezoelectric layer may comprise LN having a cut angle of any one of Euler angles (30°+/−15°, 90°+/−30°, 60°+/−30°), (90°+/−15°, 90°+/−30°, 120°+/−30°), and (150°+/−15°, 90°+/−30°, 60°+/−30°).

In some of the above aspects, the piezoelectric layer may be of a cut angle whereby the surface acoustic wave is substantially propagated as a Sezawa wave.

In some of the above aspects, an interface between the piezoelectric layer and the high acoustic velocity layer may be an open surface.

In some of the above aspects, a thickness of the IDT electrodes may be approximately between $0.001\lambda$ and $0.01\lambda$.

In some of the above aspects, the thickness of the IDT electrodes may be approximately $0.0034\lambda$.

In some of the above aspects, a thickness of the piezoelectric layer may be less than $\lambda$.

In some of the above aspects, the thickness of the piezoelectric layer may be approximately $0.1\lambda$.

In some of the above aspects, the high acoustic velocity layer may be of a thickness such that the high acoustic velocity layer appears infinite or semi-infinite to the surface acoustic wave.

In some of the above aspects, the high acoustic velocity layer may be formed from diamond.

In some of the above aspects, a thickness of the high acoustic velocity layer may be approximately $0.8\lambda$.

In some of the above aspects, the high acoustic velocity layer may have an acoustic velocity between approximately 8,000 m/s and approximately 10,000 m/s.

Some of the above aspects may further comprise at least one adhesive layer coupled between the piezoelectric layer and the equipotential layer and/or between the equipotential layer and the high acoustic velocity layer.

In some of the above aspects, the surface acoustic wave may be a substantially a pure surface wave with minimal bulk components.

Some of the above aspects may further comprise prior to providing the piezoelectric layer, providing an equipotential layer of a substantially two-dimensional (2D) conductive material over the high acoustic velocity layer.

In some of the above aspects, the piezoelectric layer may be provided by bonding the piezoelectric layer over the equipotential layer using POI process.

In various examples described herein, a multi-layer structured SAW device is described which may provide an acoustic velocity of as over 8000 m/s, a relative bandwidth of 9 to 10% and can operate at 6.0 GHz with 0.3 μm IDT electrode width.

In various examples described herein, a multi-layer structured SAW device is described which may provide an acoustic velocity of approximately 11,000 m/s, an electromechanical coupling coefficient of approximately 20% and can operate at 6.0 GHz with 0.3 μm IDT electrode width.

BRIEF DESCRIPTION OF THE DRAWINGS

FIG. 3 a cross-sectional view of an example disclosed SAW device taken along the A-A line in FIG. 1 having an equipotential layer as a short surface between the piezoelectric later and the high acoustic velocity layer;

FIG. 13 a cross-sectional view of another example disclosed SAW device taken along the A-A line in FIG. 1 with an open surface between the piezoelectric later and the high acoustic velocity layer;

Similar reference numerals may have been used in different figures to denote similar components.

DESCRIPTION OF EXAMPLE EMBODIMENTS

The present disclosure is made with reference to the accompanying drawings, in which embodiments are shown. However, many different embodiments may be used, and thus the description should not be construed as limited to the embodiments set forth herein. Rather, these embodiments are provided so that this disclosure will be thorough and complete. Like numbers refer to like elements throughout. Separate boxes or illustrated separation of functional elements or modules of illustrated systems and devices does not necessarily require physical separation of such functions or modules, as communication between such elements can occur by way of messaging, function calls, shared memory space, and so on, without any such physical separation. As such, functions or modules need not be implemented in physically or logically separated platforms, although they are illustrated separately for ease of explanation herein. Different devices can have different designs, such that while some devices implement some functions in fixed function hardware, other devices can implement such functions in a programmable processor with code obtained from a machine readable medium.

In various examples, the present disclosure describes a surface acoustic wave (SAW) device that includes at least one interdigital transducer (IDT) capable of generating incident SAWs. The disclosed example SAW devices may address the drawbacks or improve upon one or more operating characteristics of multilayer structure SAW devices such as by raising the acoustic velocity of the SAW structure while maintaining high electromechanical coupling coefficients and high impedance ratio.

Figure 1:
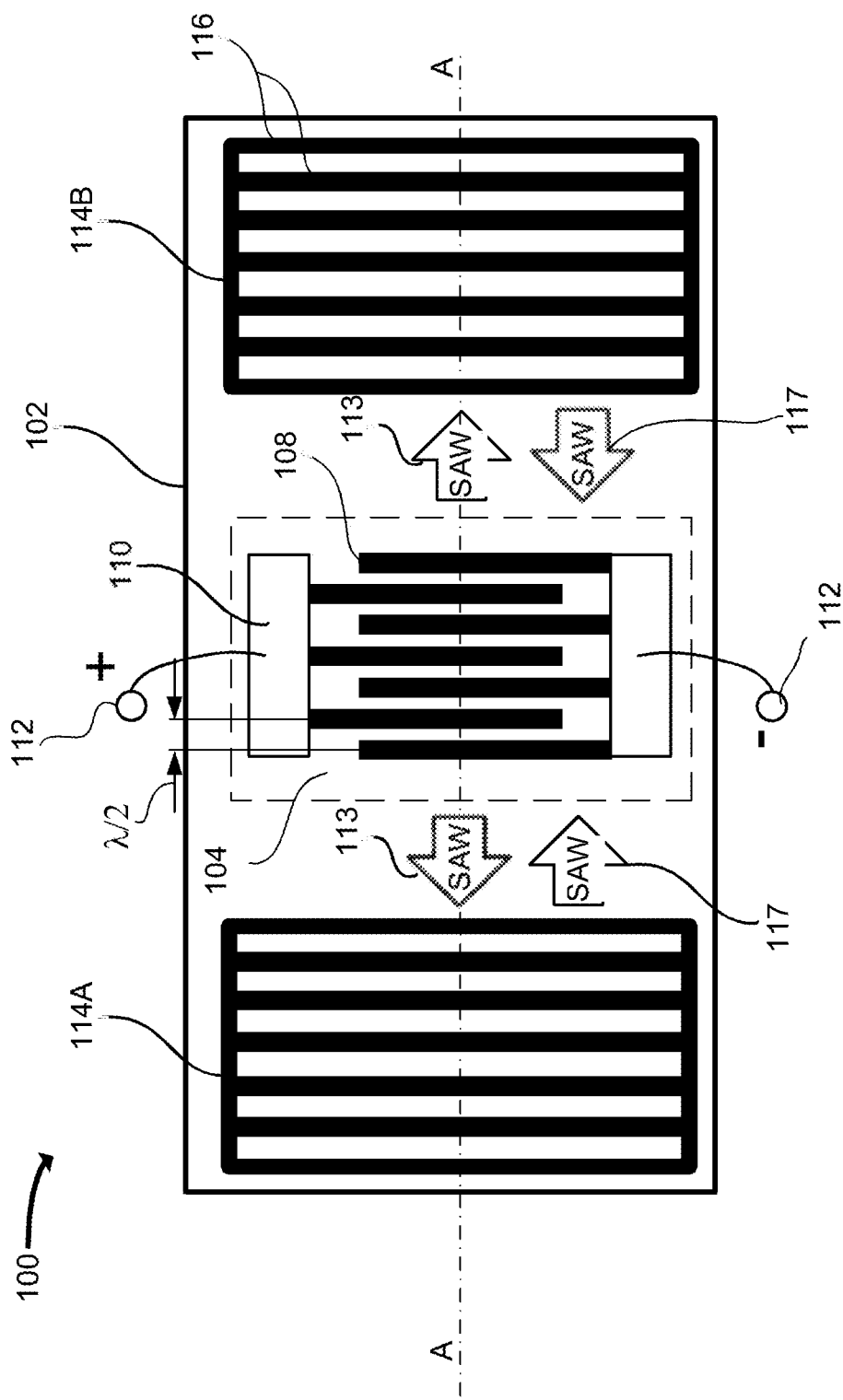
FIG. 1 is a top plan view of an example SAW device having interdigital transducer (IDT) electrodes.

An example of a physical implementation of a surface acoustic wave (SAW) device 100, such as for example a SAW resonator, is shown in FIG. 1. The dimensions of certain features have been exaggerated for illustration purposes. The SAW device 100 may be intended for use at the front-end of a radio-frequency (RF) transmitter/receiver. Although the description below makes reference to a particular SAW device 100, the techniques described herein may equally apply to other types of SAW filters and/or resonators. For example, any SAW transducer, leaky SAW filter, ladder-type filter, or other such devices may incorporate the multi-layer structure(s) described herein.

With reference to a particular example demonstrated in FIG. 1, the SAW device 100, in this example embodiment a basic resonator, may include a multi-layered body 102 (as discussed further below) with a transducer 104 as indicated by the dashed box. The transducer 104 may be coupled to the body 102. Although the embodiments herein demonstrate having one transducer for the SAW device, other embodiments may have a two or more transducers. The transducer 104 comprises a plurality of electrically conductive interdigital transducer (IDT) electrodes 108. The IDT electrodes 108 may be generally parallel to each other within the transducer 104, and each of the fingers of each IDT electrode 108 may be spaced by half of an operating wavelength ($\lambda/2$). For example, a 0.3 μm IDT electrode width may be realized with a krypton-fluoride (KrF) stepper/scanner with a laser wavelength of 248 nm. The IDT electrodes 108 of the transducer 104 may also be generally parallel to each other. The IDT electrodes 108 may be electrically coupled to lead-out bonding pads 110 for supplying power to the IDT electrodes 108 by way of terminals 112. The IDT electrodes 108 may have an IDT thickness between approximately $0\lambda$ and approximately $0.10\lambda$ as described in more detail below. In the present disclosure, a layer or material may be described as having a thickness of approximately $0\lambda$ to indicate that the layer or material provides equal electrical potential (or equipotential) and negligible mechanical mass-loading effect (e.g., for simulation purposes); a thickness of approximately $0\lambda$ does not indicate that the layer or material is omitted.

When power in the form of an excitation signal is supplied to input terminals 112, the IDT electrodes 108 of the transducer 104 convert the electrical signal energy into an incident SAW 113 (e.g. transduction) propagating along the body 102 at an acoustic velocity. In the illustrated embodiment, the SAW propagates bi-directionally to both sides of the SAW device 100. The SAW may be carried across the body 102 and reflected back towards the transducer 104 by reflector arrays 114A and 114B (collectively referred to as reflector arrays 114) also coupled to the body 102. It is to be understood that although two reflector arrays 114 are shown, there may be more or less than two reflector arrays located on the body 102. Each of the reflector arrays 114 comprises a plurality of electrically conductive electrodes, or reflectors 116 and are capable of reflecting the incident SAW 113. The reflectors 116 are generally parallel to each other within their respective reflector arrays 114A/B and may be shorted (as shown) or open-circuited. Each reflector 116 reflects a portion of the incident SAW 113. The distance between adjacent reflectors 116 introduces an impulse response into the reflected SAW 117. The reflected SAW 117 may then be received by electrodes 108 of the transducer 104 and converted back into an electrical signal that may be transmitted out through terminals 112, for example to be received by a processor (not shown) via an analog-to-digital converter (not shown).

The center operating frequency ($f_c$) of a SAW resonator may be given by Equation (1):

$$f_c = \frac{V}{\lambda} \qquad \text{Equation (1)}$$

Where V is the SAW acoustic velocity and λ is the operating wavelength. From Equation (1) it may be surmised that in order to achieve a high operating center frequency, it may be desirable to have a high acoustic velocity. The wavelength (λ) of the SAW may also be decreased to achieve a higher operating frequency. However, as λ dictates the distance between IDT electrodes, it may be subjected to manufacturing limitations such as lithography laser wavelength.

The bandwidth of SAW filters such as saw device 100, is dependent upon the electromechanical coupling factor k, which is defined as the square root of the ratio of the converted energy accumulated, whether mechanical or electrical, in response to an input (electrical or mechanical). The piezoelectric coupling factor can be expressed in the following Equation (2):

$$k = \sqrt{\frac{\text{converted energy}}{\text{input energy}}} \quad \text{Equation (2)}$$

Generally, the electromechanical coupling coefficient is defined as $k^2$, which can be more simply expressed as a ratio of the converted energy and the input energy. Increased value of the electromechanical coupling coefficient $k^2$ may mean an increase in the bandwidth of the corresponding SAW filter. Vice versa, a low value of electromechanical coupling coefficient $k^2$ may mean a decreased bandwidth of the filter. The coefficient $k^2$ may also be determined using Equation (3) as:

$$k^2 = \frac{\left(\frac{\pi f_r}{2 f_a}\right)}{\tan\left(\frac{\pi f_r}{2 f_a}\right)} \quad \text{Equation (3)}$$

Where $f_r$ and $f_a$ are the resonance frequency and the anti-resonance frequency of the SAW device, respectively.

Another design parameter of SAW devices includes impedance ratio, which is defined as the ratio of the impedance at the anti-resonance frequency $f_a$ over the impedance at the resonance frequency $f_r$. High values of the impedance ratio may be indicative of a high Q-factor, hence lower insertion loss and a sharper band edge, and vice versa.

Figure 2B:
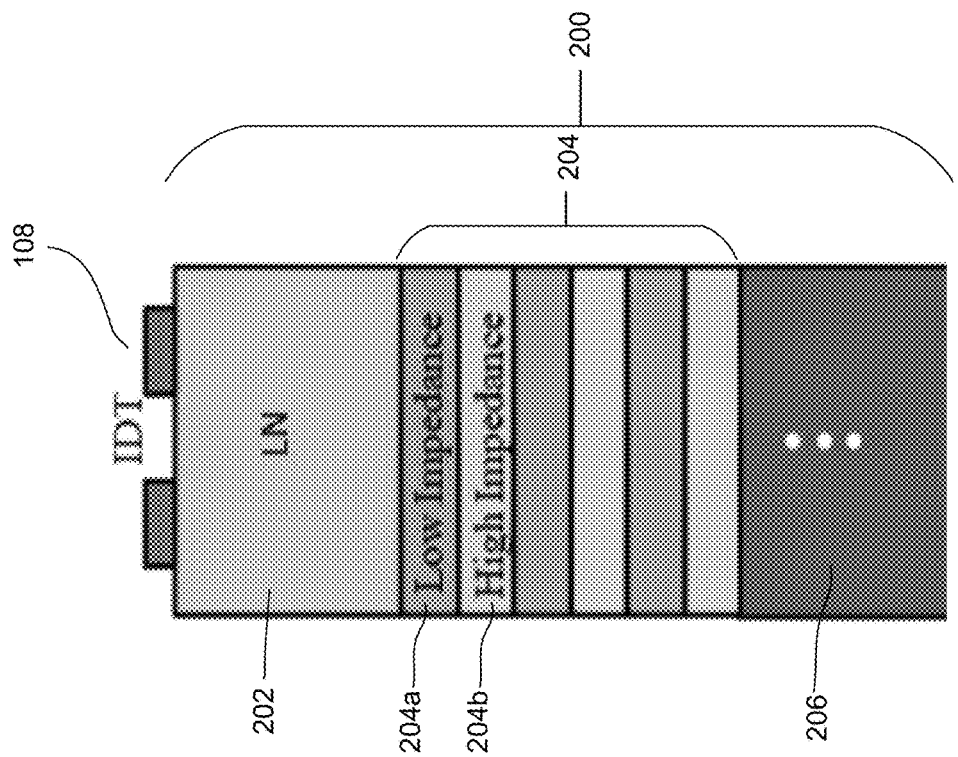
FIG. 2B is a side cross-section view of another conventional multi-layer structured SAW filter of FIG. 1 along line A-A having a LN piezoelectric layer with impedance layers.
Figure 2A:
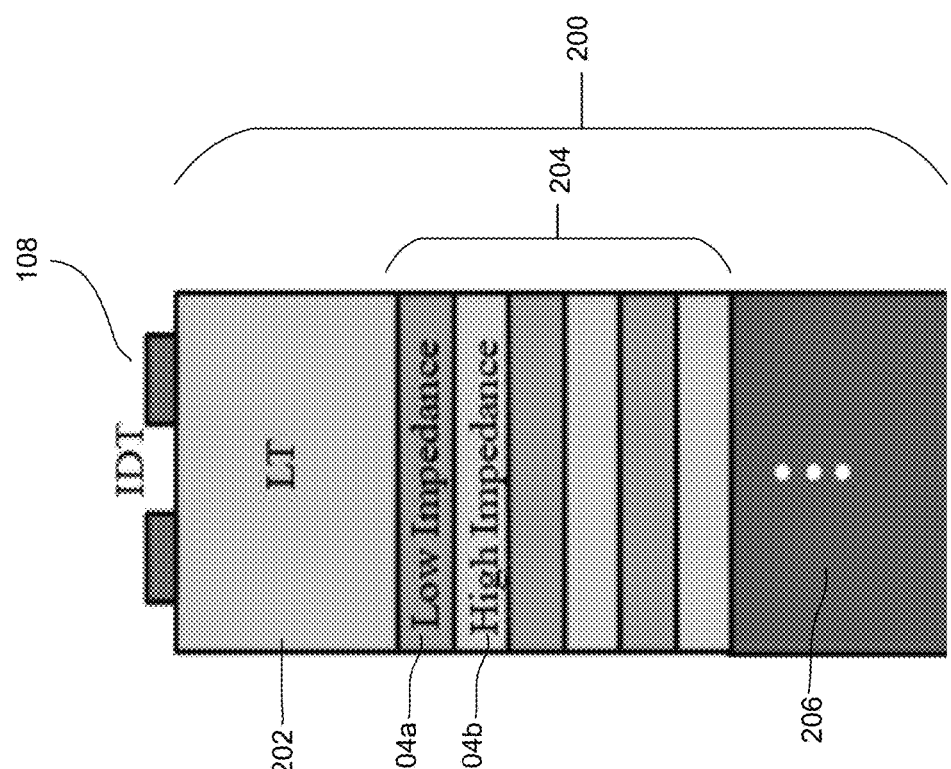
FIG. 2A is a side cross-section view of a conventional multi-layer structured SAW filter of FIG. 1 along line A-A having a LT piezoelectric layer with impedance layers.

FIGS. 2A and 2B illustrate side sectional views of different conventional multi-layer structured SAW device 100 along line A-A. In each embodiment, the multi-layered body 102 of the SAW device 100 may comprise multiple layers 200: a base layer 206, a plurality of impedance layers 204 including at least one low impedance layers 204a (e.g. aluminum nitride (AlN)) and at least one high impedance layers 204b (e.g. silicon di-oxide (SiO₂)), as well as a piezoelectric layer 202 (e.g., lithium tantalate (LT) in FIG. 2A and lithium niobate (LN) in FIG. 2B). The IDT electrodes 108 may be any suitable conductive material (e.g., copper (Cu)). The thickness of the piezoelectric layer 204 (LT, LN) may be less than one operating wavelength (λ).

Impedance layers 204, also referred to as reflective layers, are used when leaky SAW that have a vertical component in addition to the transverse wave component are generated from the piezoelectric layer 202 having a particular cut. Such impedance layers 204 have different acoustic impedance values and refractive indexes compared to those of the piezoelectric layer 202, which allows portions of the vertical wave component to be constructively reflected at the medium interface back towards the surface of the piezoelectric layer 202 to reinforce the transversely propagating SAW.

By way of an example, the multi-layer structure of the SAW filter shown in FIG. 2A, utilize a rotated Y-cut LiTaO₃ (e.g. 42°Y-X LiTaO₃ or 50°Y-X LiTaO₃) piezoelectric layer 202 to generate a leaky type Shear-Horizontal (SH) surface acoustic waves (SAWs), such as the Love wave and the Bleustein-Gulyaev-Shimizu (BGS) wave. The illustrated leaky SH-SAW device in FIG. 2A employs low impedance layers 204a made of aluminum nitride (AlN) and high impedance layers 204b made of silicon dioxide (SiO₂) in alternating fashion (e.g. AlN/SiO₂/AlN/SiO₂/ . . . , respectively) to reflect the depth direction propagating SAW, or the "leaky" SAW component back to the surface of the piezoelectric layer 202. It has been shown that such SAW filter design may be capable of achieving acoustic velocity of approximately 3990 m/s, with a coupling coefficient $k^2$ of about 7.8% and an impedance ratio of around 81 dB.

Similarly, FIG. 2B shows a SAW filter that utilizes a rotated LN (e.g. (90°, 90°, 40°) LN) piezoelectric layer 202 to generate longitudinal leaky SAW (LLSAW). The illustrated LLSAW filter in FIG. 2B also includes a multi-layered structure that includes a plurality of alternating low impedance layer 204a made of SiO₂ and high impedance layer 204b made of Pt to reflect the "leaky" SAW component back to the surface of the piezoelectric layer 202. The thickness of the low impedance layer 204a and the high impedance layer 204b are typically limited to be one half of the operating wavelength (λ) within the layer medium in order to achieve constructive reflection. It has been shown that the embodiment of LLSAW filter shown in FIG. 2B may be capable of achieving acoustic velocity of approximately 6035 m/s, with a coupling coefficient $k^2$ of about 17.6% and an impedance ratio of around 71 dB.

In SAW devices with a multi-layer body 102, it typically needs two to three high-impedance and low impedance layers 204 to effectively reflect a majority portion of the depth-direction propagating SAW back towards the surface of the body 102. With a typical thickness of λ/2, total of all impedance layers 204 may be approximately 2λ to 3λ in thickness. This way, the depth of the impedance layers 204 may effectively be viewed as semi-infinite to the vertical wave component such that the base layer 206 has negligible impact on wave propagation.

An example embodiment of a multi-layer structured SAW device 300 in accordance with the present disclosure taken along the A-A line in FIG. 1 is shown in FIG. 3. The multi-layered body 102 of the SAW device 300 may comprise four layers 302: a base layer 310, a high acoustic velocity layer 308 (e.g. a diamond layer), an equipotential layer 306, and a piezoelectric layer 304 (e.g. a LN layer). The IDT electrodes 108 may be provided on a first surface of the piezoelectric layer 304. In some aspects, the piezoelectric layer 304 may be configured to generate and receive SAW signals. The equipotential layer 306, positioned between the piezoelectric layer 304 and the high acoustic velocity layer 308 may be configured for electric potential control as the equipotential layer 306 is a short surface or ground surface as a boundary condition. The high acoustic velocity layer 308 may be configured to increase the acoustic wave velocity. The combination of piezoelectric layer 304 cut and thickness, electric short-surface boundary condition controlled by equipotential layer 306, and the high acoustic velocity layer 308 as discussed in more detail below may achieve a high coupling coefficient. As will be described in more detail below, in at least one aspect, the SAW devices in accordance with the present disclosure utilizes Sezawa wave mode (a higher order of the Rayleigh wave mode in a multilayer structure) SAW which has no depth direction propagating, or "leaky" component, SAW. Therefore, no multi-layer impedance reflective layers are needed.

Figure 19:
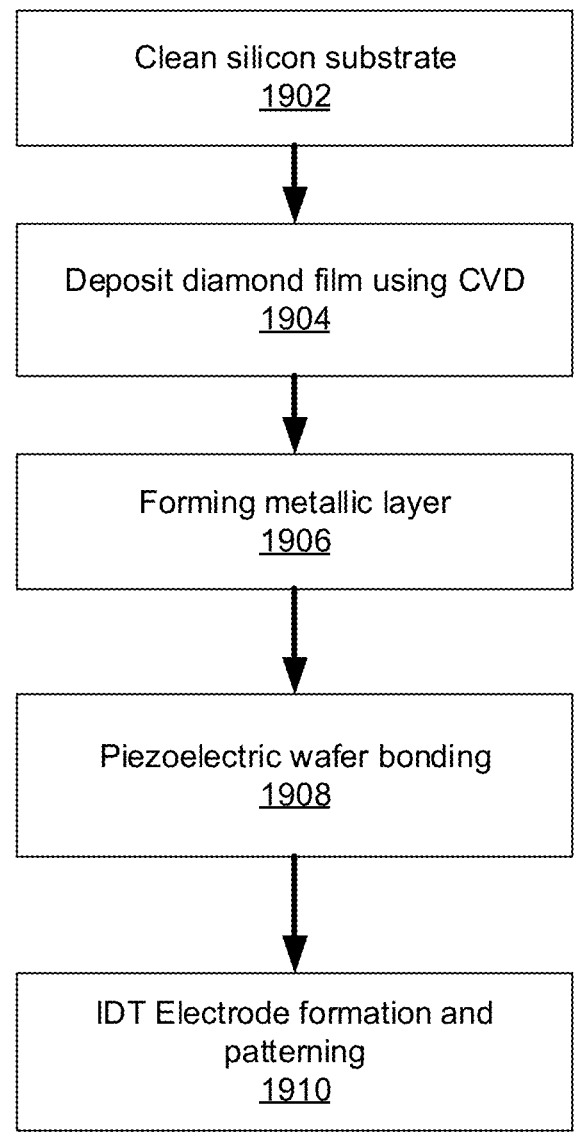
FIG. 19 is a flowchart illustrating an example method for fabricating the SAW device of FIG. 3 and FIG. 13.

The layers 302 may be provided on top of each other generally using any suitable semiconductor manufacturing techniques as further described with reference to FIG. 19 below. In some embodiments, due to the difference in acoustic impedance between the different layers 302, a Sezawa wave mode may generally be created in addition to the Rayleigh wave mode (also called the fundamental mode). The Sezawa waves may exist in multi-layered SAW devices when a layer's SAW acoustic velocity is greater than that of the overlaid piezoelectric layer. Generally, Sezawa wave exists in so called "slow on fast" structures, which means Sezawa wave can exist when thin piezoelectric layer of lower velocity is deposited on regular bulk substrate (e.g., diamond layer) of higher velocity. Higher order acoustic wave modes, such as a Sezawa wave mode, may propagate better than Rayleigh waves in a layered structure, such as that of SAW device 300, for a high acoustic velocity layer with a higher acoustic velocity than the overlying piezoelectric layer 304. The Sezawa wave may exhibit a larger phase velocity (e.g. higher resonant frequency) than the Rayleigh wave for similar thicknesses, and thus may be desirable for some higher frequency applications. Generally, in some embodiments it is desirable to choose a wave mode that has a high electromechanical coupling coefficient where the other wave modes have a low electromechanical coupling coefficient in order to limit spurious or unwanted signals in the SAW device 300.

Figure 4:
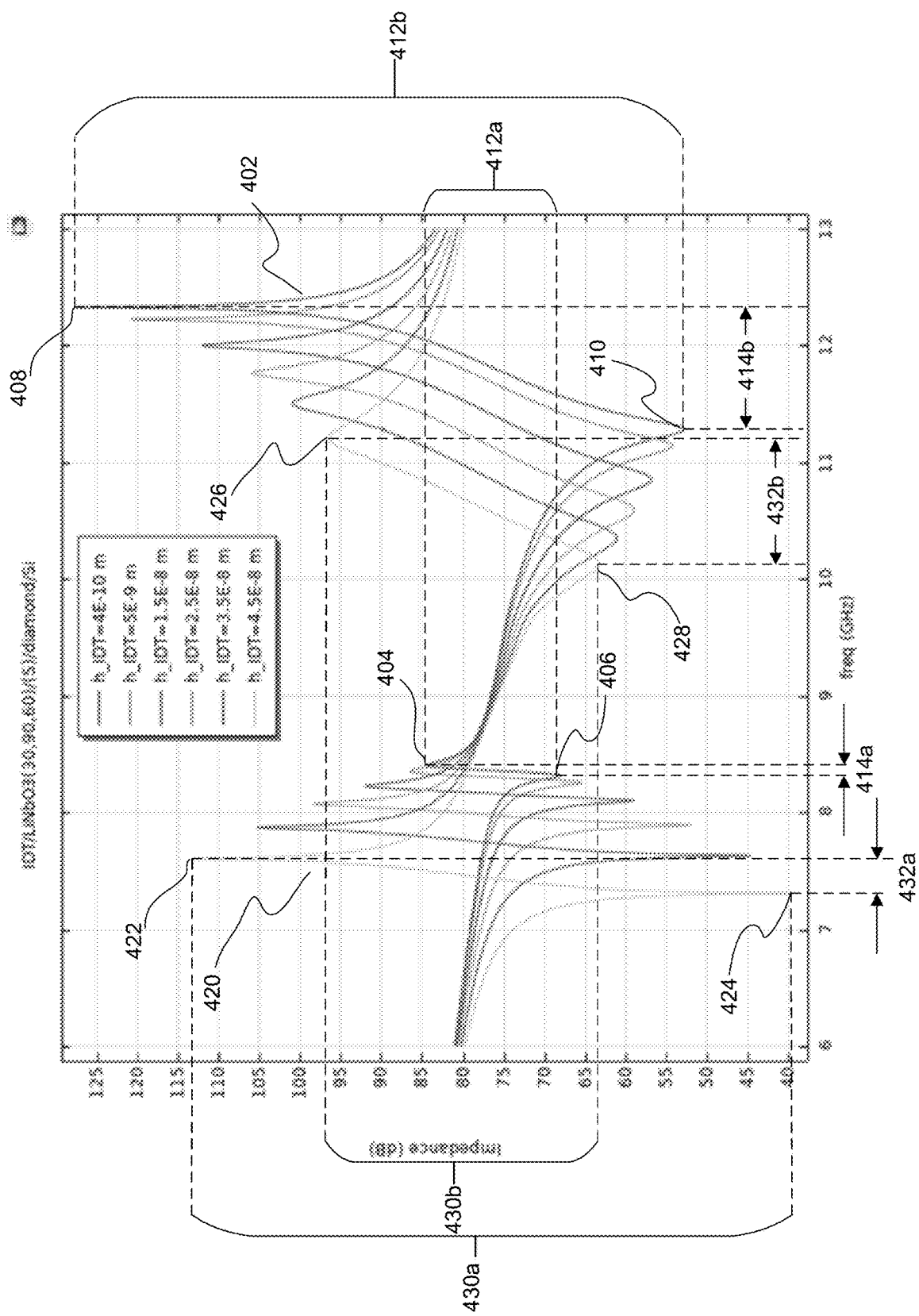
FIG. 4 is a plot of frequency response of device impedance in the SAW device of FIG. 3 for various IDT electrode thickness values.

The IDT electrodes 108 may be placed on a first surface of piezoelectric layer 304 of thickness $t_1$ generally using any suitable techniques as further described with reference to FIG. 19 below. The impact of IDT electrode 108 thickness is simulated using the commercial finite element analysis software, COMSOL Multiphysics. Plots of the simulation results are shown in FIG. 4. The simulations, equations, and graphs used or presented herein are merely for demonstration and illustration only and are not intended to be limiting or promissory.

The device under simulation is a SAW resonator that includes a piezoelectric layer 304 comprising LN (30°, 90°, 60°) with a thickness of 0.1λ capable of generating a SAW that is substantially a surface wave, an equipotential layer 306 of graphene with 0λ thickness as describe in more detail below, the high acoustic velocity layer 308 comprising diamond with a thickness of 0.8λ on top of a silicon base layer 310, where λ=1 μm. FIG. 4 shows simulation results of device impedance expressed in decibel (dB) scale as a function of frequency in Giga-Hertz (GHz). The device is simulated for various IDT electrode 108 thickness values ranging from $4 \times 10^{-10}$ m (or 4 Angstroms) to $4.5 \times 10^{-8}$ m (or 450 Angstroms).

As shown in FIG. 4, each simulation result includes a resonance and anti-resonance frequency pair, indicative of a Rayleigh wave and a Sezawa wave, respectively. Particularly, the simulation result for IDT electrode thickness value of 4 Angstroms as indicated by plot 402, includes a first resonance frequency 406 of approximately 8.3 GHz with a corresponding impedance value of approximately 66 dB. A first anti-resonance frequency 404 may be located at approximately 8.4 GHz with a corresponding impedance value of approximately 84 dB. A second resonance frequency 410 is located at approximately 11.4 GHz with a corresponding impedance value of 53 dB. A second anti-resonance frequency 408 is located at approximately 12.4 GHz with a corresponding impedance of 128 dB. The first resonance and anti-resonance frequency pair (406, 404) is representative of the Rayleigh wave response, and the second resonance and anti-resonance frequency pair (410, 408) is representative of the Sezawa wave response. Using Equation (3), the coefficient $k^2$ for the Sezawa wave for plot 402 may be determined to be approximately 18.4% and approximately 2.9% for the Rayleigh wave. Accordingly, as may be observed from plot 402, the Sezawa wave exhibits a much wider bandwidth and higher impedance ratio (128−53=75 dBc for Sezawa vs. 84−66=18 dBc for Rayleigh). As another example, the simulated results of an IDT electrode thickness of 450 Angstroms is denoted by plot 420, which includes a first resonance frequency 424 of approximately 7.3 GHz with a corresponding impedance value of approximately 39 dB. A first anti-resonance frequency 422 of the plot 420 may be located at approximately 7.6 GHz with a corresponding impedance value of approximately 113 dB. A second resonance frequency 428 of the plot 420 is located at approximately 10.2 GHz with a corresponding impedance value of 64 dB. A second anti-resonance frequency 426 of the plot 420 is located at approximately 11.2 GHz with a corresponding impedance of 97 dB. Applying Equation (3) to the plot 420 would yield a higher coefficient $k^2$ value for the Rayleigh wave than the Sezawa wave. This may be observed from plot 420 where the impedance ratio of the Rayleigh wave is better than that of the Sezawa wave, which may be indicative that in the case of plot 420, the Rayleigh wave has much lower loss than Sezawa wave. The first resonance and anti-resonance frequency pair (424, 422) is representative of the Rayleigh wave response of the plot 420, while the second resonance and anti-resonance frequency pair (428, 426) is representative of the Sezawa wave response.

From Equation (1) it can be discerned that the acoustic velocity V is the product of frequency and operating wavelength (λ). With the operating wavelength (λ) fixed by the distance between individual IDT electrodes 108 (λ/2), the higher the acoustic velocity, the higher the operating frequency will be, and vice versa. In the illustrate simulation result, where the operating wavelength (λ) is set to 1 μm, the Sezawa wave demonstrates a much higher operating frequency compared to that of its corresponding Rayleigh wave, indicative of a higher acoustic velocity. For example, at an IDT electrode thickness of 4 Angstroms, the Sezawa wave may permit an acoustic velocity of over 11,000 m/s compared to the approximately 8,000 m/s of the Rayleigh wave.

As may be observed from the simulation plots, as the IDT electrode thickness increases, the Rayleigh wave strengthens at the expense of the Sezawa wave. For example, increasing IDT electrode thickness causes the impedance ratio of the Sezawa wave, characterized by the difference in the impedance values between the Sezawa mode anti-resonance and the resonance frequencies, to decrease, and the impedance ratio of the Rayleigh wave, the difference in impedance value between the Rayleigh mode anti-resonance and the resonance frequency pair, to increase. For example, with an IDT electrode thickness of 4 Angstroms, the plot 402 shows the simulated device having an impedance ratio 412a of approximately 18 dB under Rayleigh mode and an impedance ratio 412b of approximately 75 dB under Sezawa mode. When the IDT electrode thickness increases to 450 Angstroms, the simulated result 420 shows an impedance ratio 430a of approximately 74 dB under Rayleigh mode and an impedance ratio 430b of approximately 43 dB under Sezawa mode. Accordingly, thinner IDT electrode 108 thickness generally promotes SAW propagation under the Sezawa wave mode in the described multi-layer substrate.

As may be observed from FIG. 4, when the IDT metal thickness increases, the performance of Rayleigh wave becomes much better than that of the Sezawa wave, which renders the Sezawa wave practically difficult to use, in part due to low impedance ratio and small coefficient $k^2$ value which is indicative of narrow bandwidth. In such cases, use of Rayleigh wave when IDT metal thickness increases may result in an acoustic velocity of only about 8000 m/s, thereby reduced the operating frequency.

Conventionally, IDT electrodes made out of metals such as aluminum and copper have a thickness of approximately $0.06\lambda$-$0.1\lambda$, which in RF applications, is in the orders of hundreds or thousands of angstroms. Such orders of magnitude of IDT thickness would likely generate strong Rayleigh wave with a weak Sezawa wave similar to the simulated result 420 shown in FIG. 4. Accordingly, in some embodiments, the thickness of the IDT electrode 108 should be minimized such that the IDT electrode 108 has a thickness much thinner than the piezoelectric layer 304 thickness $t_1$ of between $0.001\lambda$ and $0.01\lambda$. In particular, the IDT electrode 108 thickness may be negligible or ultrathin, such that the IDT electrode 108 has no or negligible mechanical weight (that is, has no mechanical mass-loading effect). It should be understood that although the IDT electrode 108 may be described as having substantially no mechanical weight (i.e. ultrathin) and still sufficient to provide electrical conduction.

However, one of the physical limitations to conventional IDT electrode metal thickness has been that at certain thickness value (i.e. 15-20 nm for gold IDT electrodes), the sheet resistance of the IDT may increase dramatically so that the IDT electrodes exhibits non-conductive behavior. Additionally, it has been found that the thinner the metal thickness, the easier it may be for the metal to have voids and hillocks that increase ohmic loss and eventually loss electric conductivity. Thus, in some embodiments, to achieve IDT electrodes 108 that provide electrical conduction but substantially no mechanical weight, the IDT electrodes 108 may be made of a monolayer graphene, an excellent electrical conductor that may be formed as a single layer of carbon atoms in a substantially two-dimensional (2-D) lattice structure. Here, 2-D materials, sometimes referred to as single-layer materials, refer to crystalline materials consisting of a single layer of atoms, which may exhibit negligible mechanical mass-loading effect. The phrase "substantially" refers to few-layer 2-D materials which may include two to ten layers of 2-D materials. In some embodiments, the thickness of graphene is approximately $0.0034\lambda$, which corresponds to the thickness of approximately 10 graphene layers with a wavelength of 1 μm. This may be approximately the maximum thickness for few-layer graphene electrode. At such thickness, IDT electrode 108 made with graphene may be capable of realizing the simulated results similar to that of simulation result 402 in FIG. 4. In other embodiments, the IDT electrode 108 may be a multi-layer graphene having 2-10 atomic layers. A multi-layer graphene IDT electrode 108 may achieve a better stress response, at the expense of filter performance compared to a monolayer graphene IDT electrode 108. Any other substantially two-dimensional conductive material, such as borophene may be a suitable material for the IDT electrode 108 provided the requirements for sufficient electrical conduction, negligible mechanical weight, are satisfied. In some other embodiments, IDT electrode 108 may be made from $SOCl_2$ doped few-layer graphene (typically between 2 to 6 layers) which also has low sheet resistance (therefore very high electric conductivity).

The equipotential layer 306 is an electrically short-circuited surface (also referred to as the "short surface") coupled between a second surface of the piezoelectric layer 304 that opposes the first surface where the IDT electrodes 108 are located, and a first surface of the high acoustic velocity layer 308.

Figure 5:
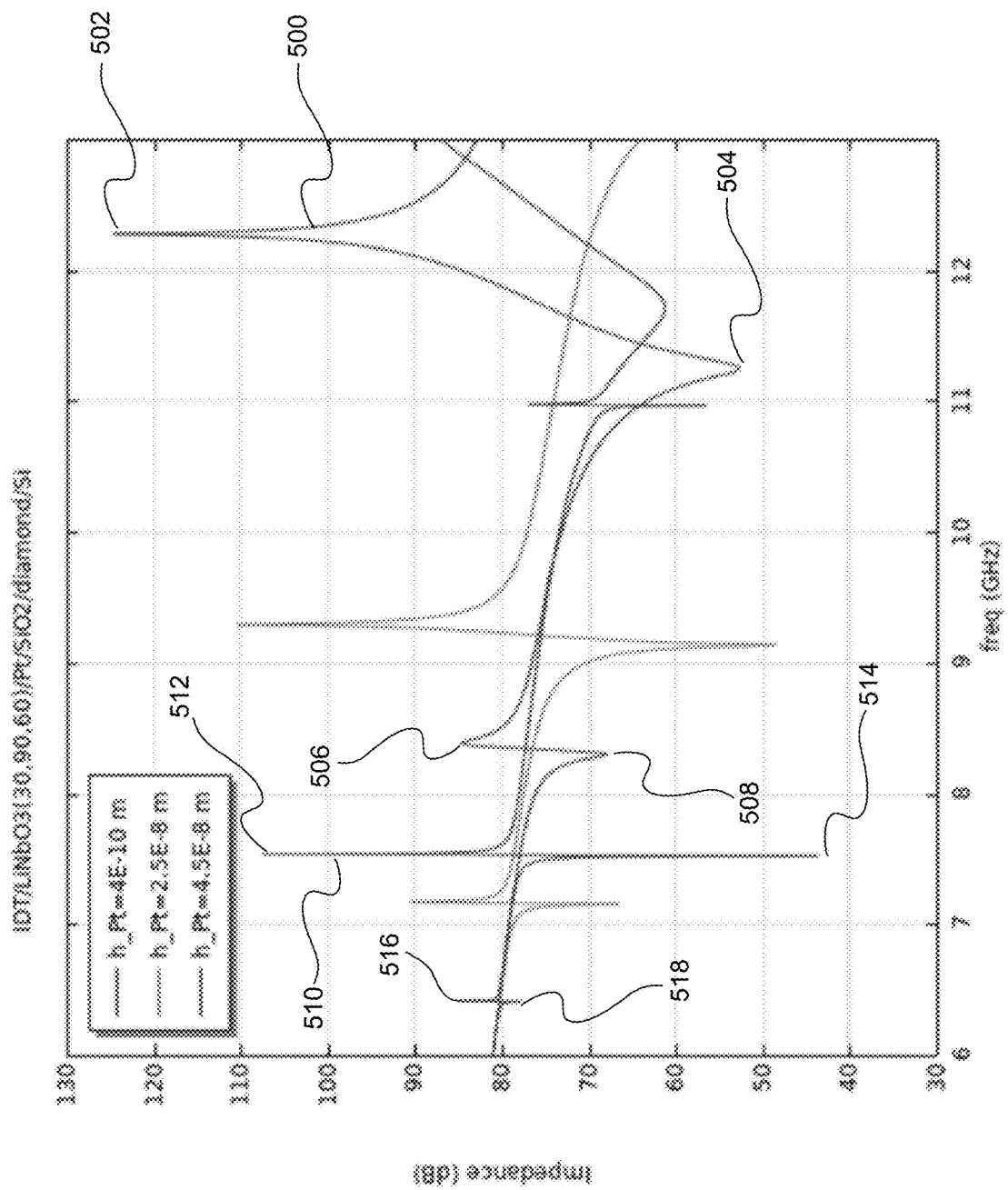
FIG. 5 is a plot of frequency response of device impedance in the SAW device of FIG. 3 for various equipotential layer thickness values.

The impact of equipotential layer 306 thickness is simulated using the COMSOL Multiphysics software. Plots of the simulation results are shown in FIG. 5. The simulations, equations, and graphs used or presented herein are merely for demonstration and illustration only and are not intended to be limiting or promissory.

The device under simulation is a SAW filter that includes IDT electrode 108 of $0.0004\lambda$ in thickness formed on top a piezoelectric layer 304 comprising LN (30°, 90°, 60°) with a thickness of $0.1\lambda$. An equipotential layer (Pt) is deposited between the piezoelectric layer and a diamond high acoustic layer 308 of $0.8\lambda$ in thickness. The equipotential layer (Pt) is coupled to the diamond layer via an adhesive layer of $0.004\lambda$ thick silicon diode ($SiO_2$). The diamond high acoustic layer 308 is formed on top of a silicon base layer 310. The device was simulated with an operating wavelength $\lambda$ of 1 μm. FIG. 5 shows frequency response of the device impedance plots of the simulated device expressed in decibel (dB) scale. The device is simulated for equipotential layer 306 thickness values of $4 \times 10^{-10}$ m (or 4 Angstroms), $2.5 \times 10^{-8}$ m (or 250 Angstroms), and $4.5 \times 10^{-8}$ m (or 450 Angstroms).

As it can be observed from FIG. 5, thinner equipotential layer thickness promotes SAW propagation under the more desirable Sezawa wave mode. Specifically, for an equipotential layer 306 thickness of 4 Angstroms as noted by plot 500, the Sezawa wave impedance ratio as defined by the resonance and anti-resonance frequencies 504 and 502, respectively, is approximately 73 dB. In comparison, the impedance ratio of the Rayleigh wave at an equipotential layer thickness of 4 Angstroms is approximately 17 dB as defined by the respective Rayleigh wave resonance and anti-resonance frequencies 508, 506. In addition, the coupling coefficient of the Sezawa wave is much higher as evidenced by the wider bandwidth compared to that of the Rayleigh wave. The operating frequency, which is indicative of the acoustic velocity, is much higher for the Sezawa wave compared to the Rayleigh wave at thin equipotential layer thickness. Unlike the IDT electrode thickness, an increase in equipotential layer thickness weakens both the Sezawa wave as well as the Rayleigh wave. For example, as the equipotential layer thickness increases from 4 Angstroms to 450 Angstroms, which is denoted by simulation plot 510, the Sezawa wave resonance and anti-resonance frequency pair has shifted to a much lower frequency (e.g. around 7.5 GHz) compared to the 11 to 12 GHz range of simulation plot 500. The difference between the Sezawa resonance and anti-resonance frequencies, which is indicative of the coupling coefficient and the filter bandwidth, becomes difficult to discern on the GHz scale at 450 Angstroms. The impedance ratio of the Sezawa wave in simulation plot 510 decreases to approximately 65 dB (e.g. the difference between resonance frequency 514 and anti-resonance frequency 512) while the Rayleigh wave impedance ratio decreases to approximately 7 dB (e.g. the difference between resonance frequency 518 and anti-resonance frequency 516). Based on the simulation results shown in FIG. 5, it may be observed that a thin equipotential layer 306 may promote SAW propagation under the Sezawa wave mode.

Accordingly, the equipotential layer 306 has a thickness that is much thinner than the first thickness $t_1$ of the piezoelectric layer 304. In particular, the equipotential layer thickness may be negligible, such that the equipotential layer 306 has no or negligible mechanical weight (that is, has no mechanical mass-loading effect). It should be understood that although the equipotential layer 306 may be described as having substantially no mechanical weight, the equipotential layer 306 is not omitted. Rather, the equipotential layer 306 is sufficient to provide electrical conduction over its entirety to an electrical ground.

In order to achieve an equipotential layer 306 that provide electrical conduction but substantially no mechanical weight, the equipotential layer 306 of some embodiments may be made of a monolayer of any substantially two-dimensional conductive material such as graphene and borophene provided the requirements for sufficient electrical conduction, negligible mechanical weight, are satisfied. In some embodiments, a few layers, such as 2 to 10 layers, of the substantially two-dimensional conductive material may be used to achieve a better stress response, at the expense of a slight degradation in filter performance. In some embodiments, polishing the surface of the high acoustic velocity layer 308 to <0.5 nm surface roughness may enable direct wafer bonding of piezoelectric wafers directly onto a high acoustic velocity layer substrate such as diamond substrate, without the use of an adhesive layer. In some further embodiments, the equipotential layer may comprise of $SOCl_2$ doped few-layer graphene (i.e. 2 to 6 layers), which also has low sheet resistance and therefore high electric conductivity.

In some embodiments, the equipotential layer 306 is deposited on a high acoustic velocity layer 308 via an adhesive layer (not shown). Adhesive layers may provide a very smooth surface for bonding and thereby ease the wafer-bonding process. The adhesive layer may be made of $SiO_2$, which is commonly used as an adhesive layer in silicon-on-insulator (SOI) wafer bonding process. The effects of adhesive layer thickness is simulated using the COMSOL Multiphysics software and plots of example simulation results are shown in FIGS. 6A and 6B.

Figure 6A:
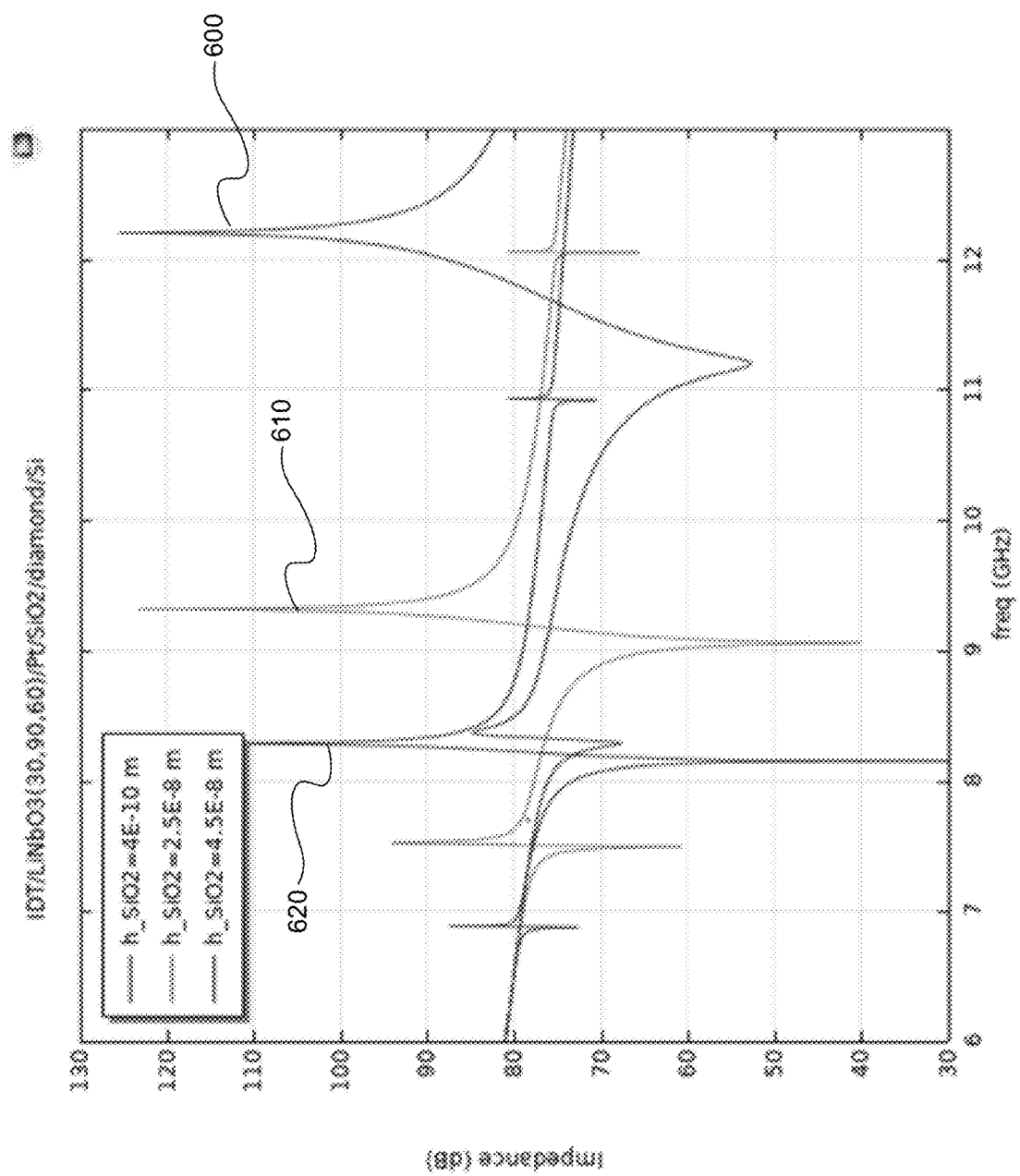
FIG. 6A is a plot of frequency response of device impedance in the SAW device of FIG. 3 for various thickness values of an adhesive layer between the equipotential layer and the high acoustic velocity layer.
Figure 6B:
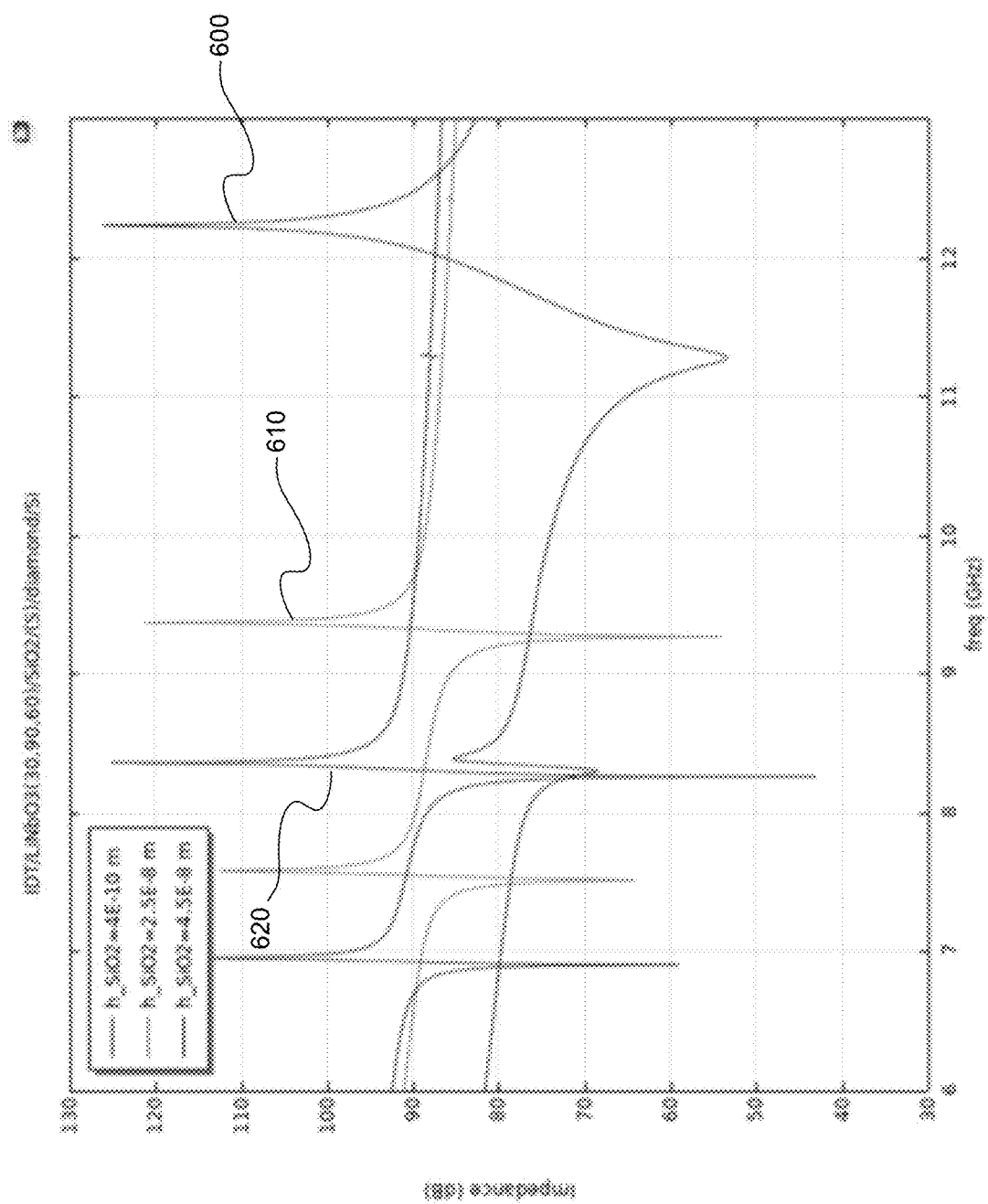
FIG. 6B is a plot of frequency response of device impedance in the SAW device of FIG. 3 for various thickness values of an adhesive layer between the piezoelectric layer and the equipotential layer.

In FIG. 6A, the simulated device comprises IDT electrode 108 of 0.0004λ in thickness on a 0.1λ thick piezoelectric layer 304 comprising LN (30°, 90°, 60°). The simulated device further comprises a platinum equipotential layer of 0λ thickness coupled to the piezoelectric layer 304 on one side and coupled to a 0.8λ thick diamond high acoustic layer 308 via an adhesive layer of silicon diode ($SiO_2$). The diamond high acoustic layer 308 is deposited on top of a silicon base layer 310. The device was simulated for an operating wavelength λ of 1 μm. Thickness of the adhesive layer is varied to be 4 Angstroms, 250 Angstroms, and 450 Angstroms. The simulation plots 600, 610, and 620 show the impedance characteristics of the simulated device for each of the foregoing adhesive layer thickness values, respectively, in FIG. 6A.

As may be observed from FIG. 6A, increasing adhesive layer thickness improved impedance ratio as the difference between resonance and anti-resonance pairs for simulation results 600, 610, and 620 increased. However, the coupling coefficient, as characterized by the difference between each resonance and corresponding anti-resonance frequencies, decreased as the adhesive layer thickness increased. Additionally, it can be observed the resonance and anti-resonance frequency pair of each simulation result shifted to lower frequency ranges, indicative of a slower acoustic velocity of the simulated device.

In another simulation, instead of coupled between the equipotential layer and the high acoustic velocity layer, an adhesive layer is coupled between the piezoelectric layer and an ideal short surface equipotential layer 306 on a diamond high acoustic velocity layer 308. The thickness of the adhesive layer is adjusted to have values of 4 Angstroms, 250 Angstroms, and 450 Angstroms, and plots of the results are shown in FIG. 6B. It can be observed that the simulation result 620 for the 4-Angstrom adhesive layer exhibits the highest impedance ratio, acoustic velocity, and coupling coefficient. As the adhesive layer thickness is increased, the device exhibits similar decreased acoustic velocity and coupling coefficient as shown in FIG. 6A.

Accordingly, in embodiments where an adhesive layer is present, it may be preferred to minimize the thickness of any such adhesive layer in order to promote Sezawa wave mode propagation characteristics such as high acoustic velocity and high coupling coefficient. The thickness of the adhesive layer may be dependent on fabrication methods. For example, silicon dioxide films of 100 to 200 nm in thickness may be deposited by RF diode sputtering. As will be discussed in more detail with respect to FIG. 19, known methods of piezoelectric-on-insulator (POI) bonding technology may permit piezoelectric layer 304, equipotential layer 306, and high acoustic layer 308 to be bonded in the absence of any adhesive layers. Thus, in some embodiments, no adhesive layer may be present.

Figure 7:
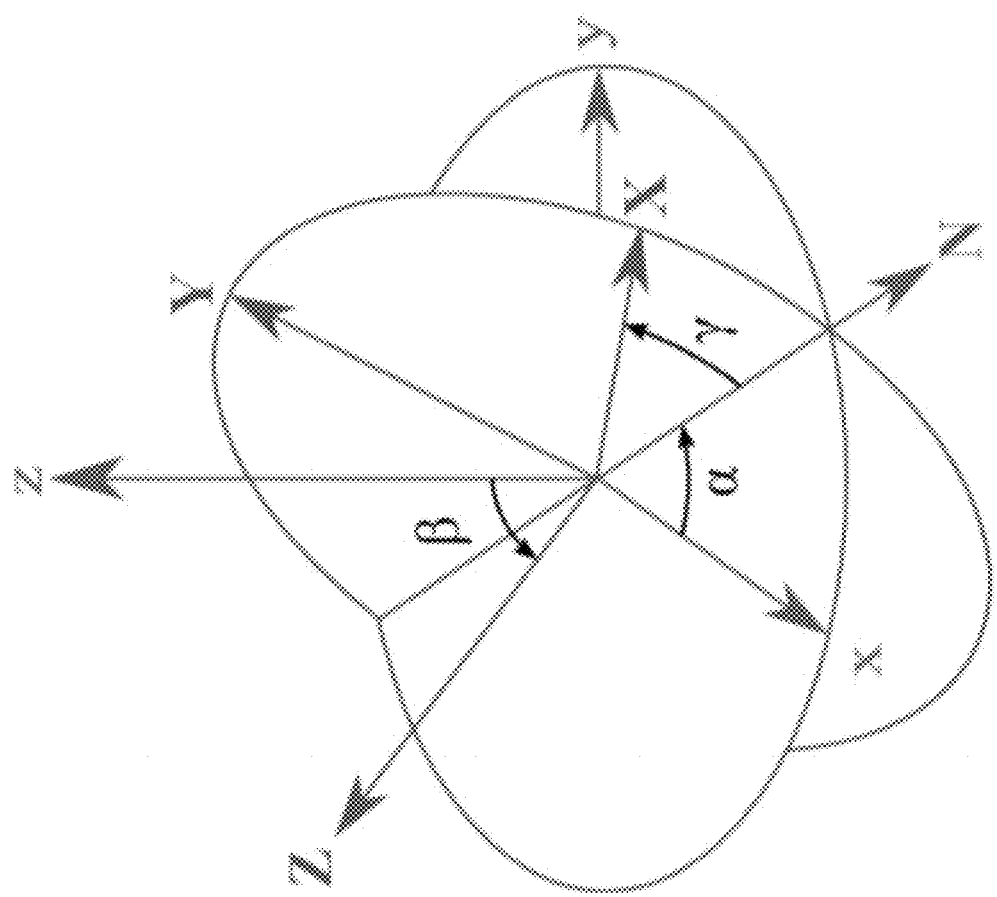
FIG. 7 is a perspective view of Euler angles defined with respect to the three dimensional Cartesian coordinate system.

The piezoelectric material within the piezoelectric layer 304 is made up of a crystalline structure. The crystalline structure is made up of multiple unit cells which have polarization. The crystalline structure is cut from crystal bulk with a predetermined crystal orientation, with respect to the crystallographic axes. Piezoelectric materials are anisotropic, meaning that the electromechanical properties of piezoelectric materials vary depending on the crystal orientation. Using orientation to enhance certain functional properties has been recognized as an important method due to the anisotropy of the piezoelectric material. To further enhance the piezoelectricity, the material exhibiting piezoelectric effect may be ferroelectrically polarized so that the electric dipoles become aligned with the same orientation, thus making one side of the material more positive and an opposing side more negative. As commonly used in the art, the cut angle of piezoelectric material is characterized using conventions by extrinsic rotations where Euler or Tait-Bryan angles are used to characterize three elemental rotations about fixed axes of a coordinate system, such as the three dimensional Cartesian coordinate system. Specifically, Euler angles $\alpha, \beta, \gamma$ may be used to denote rotational angles about the Z, X, and Z axes of a three-dimensional Cartesian coordinate system, respectively as shown in FIG. 7. In some embodiments, the z-axis is used to denote the poling direction. The axes of the original fixed axes are denoted as x, y, z and the axes of the rotated frame as X, Y, Z. The geometrical definition (sometimes referred to as static) begins by defining the line of nodes as the intersection of the planes x-y and X-Y (it can also be defined as the common perpendicular to the axes z and Z and then written as the vector product N=z×Z). Using N, the three Euler angles can be defined as: $\alpha$ is the angle between the x-axis and the N axis (x-convention—it could also be defined between $\gamma$ and N, called y-convention); $\beta$ is the angle between the z-axis and the Z-axis; and y is the angle between the N-axis and the X-axis (x-convention).

In some embodiments, it may be of interest to select a cut of the piezoelectric material that, in combination with the high acoustic velocity layer, provide both high coupling coefficient as well as high acoustic velocity. In some embodiments, it may be of interest to select a cut of the piezoelectric material, in combination with the high acoustic velocity layer, that may be capable of generating a SAW wave that propagates primarily under the Sezawa wave mode. In some embodiments, the piezoelectric layer is a thin film layer such that the generated acoustic wave may be affected by the presence of the high acoustic velocity layer. It may be of interest to select a cut of the piezoelectric material that, in combination with the high acoustic velocity layer, may be capable of generating a SAW that substantially a pure surface wave with minimal bulk wave components such the need for reflective layers are obviated.

The effect of piezoelectric layer 304 cut angle is simulated using the COMSOL MultiPhysics software. The simulated device is a multi-layer structured SAW device in accordance with one aspect of the present disclosure that comprises a piezoelectric layer 304 of 0.1λ LN. The multi-layer structured SAW device further includes 0λ thickness IDT electrodes on top of the piezoelectric layer 304, an ideal short surface of equipotential layer 306 located between the piezoelectric layer 304 and a 0.8λ thick diamond high acoustic velocity layer on a silicon base layer. In FIGS. 8A to 11B, the three Euler angles α, β, γ are represented by x, y, and z, respectively. It is to be understood that although simulation results described herein are based on a LN piezoelectric layer, the LN can be replaced with other piezoelectric single crystal materials, such as LiTaO$_3$. It is also to be understood that with a different piezoelectric layer material, detail performance of such material may need to be simulated and confirmed in accordance with the present disclosure.

Figure 8A:
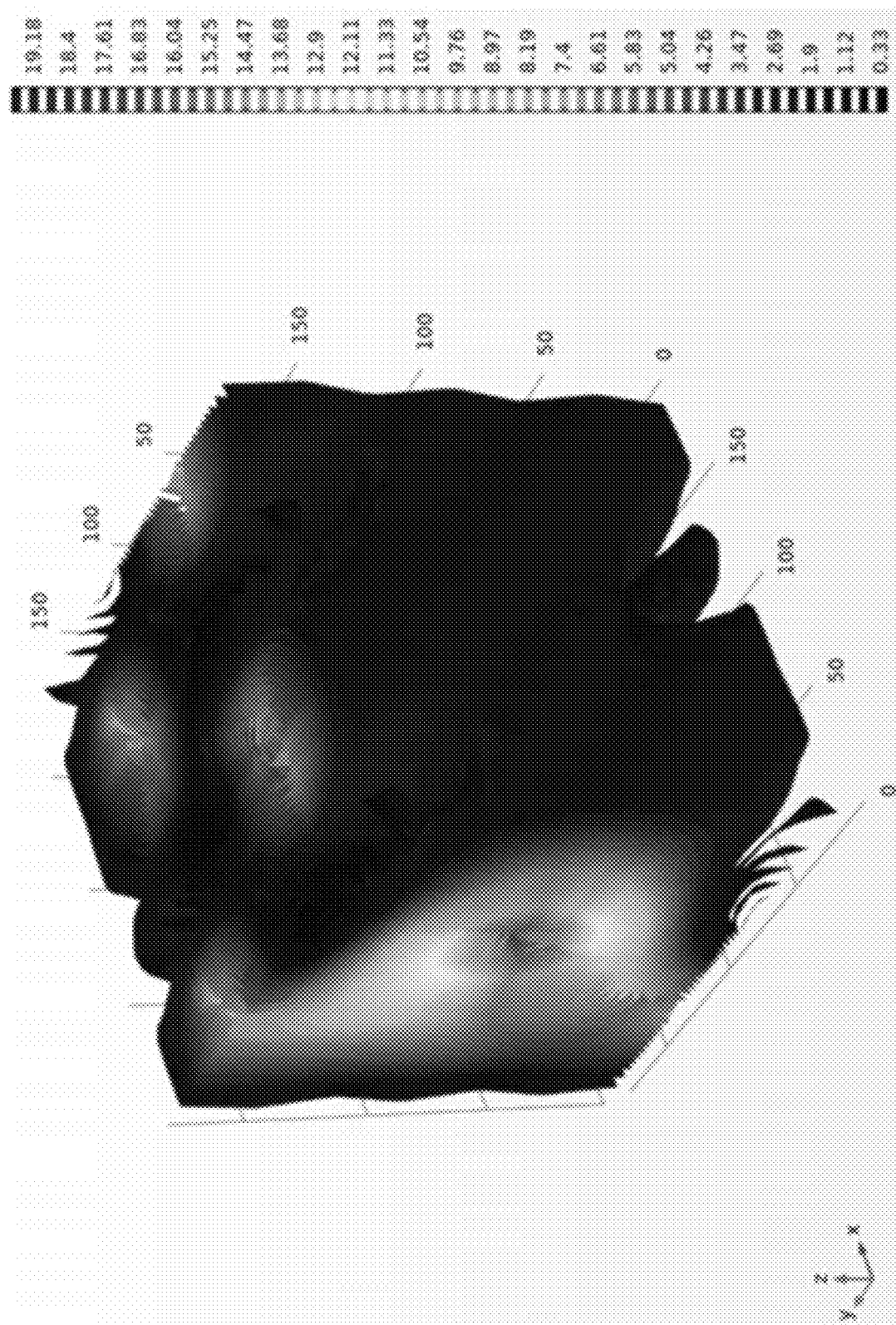
FIG. 8A is a 3-D Sezawa wave mode electromechanical coupling coefficient plot of the SAW device in FIG. 3 for all cut angles of a LN piezoelectric layer.
Figure 8B:
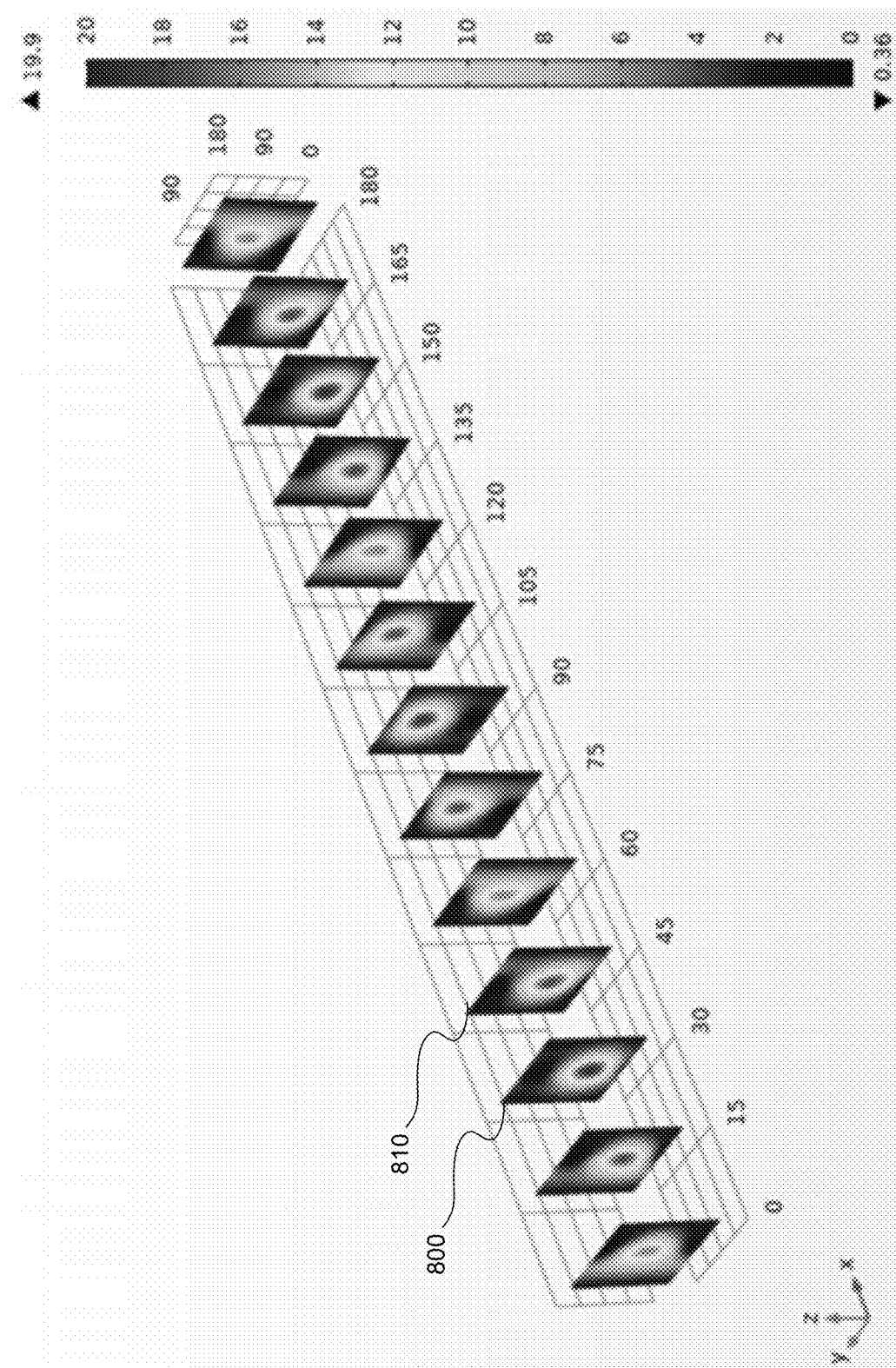
FIG. 8B illustrates various cross-sectional 2-D plots of the 3-D Sezawa wave mode electromechanically coupling coefficient plot in FIG. 8A at α cut angles in 15 degree increments.
Figure 8C:
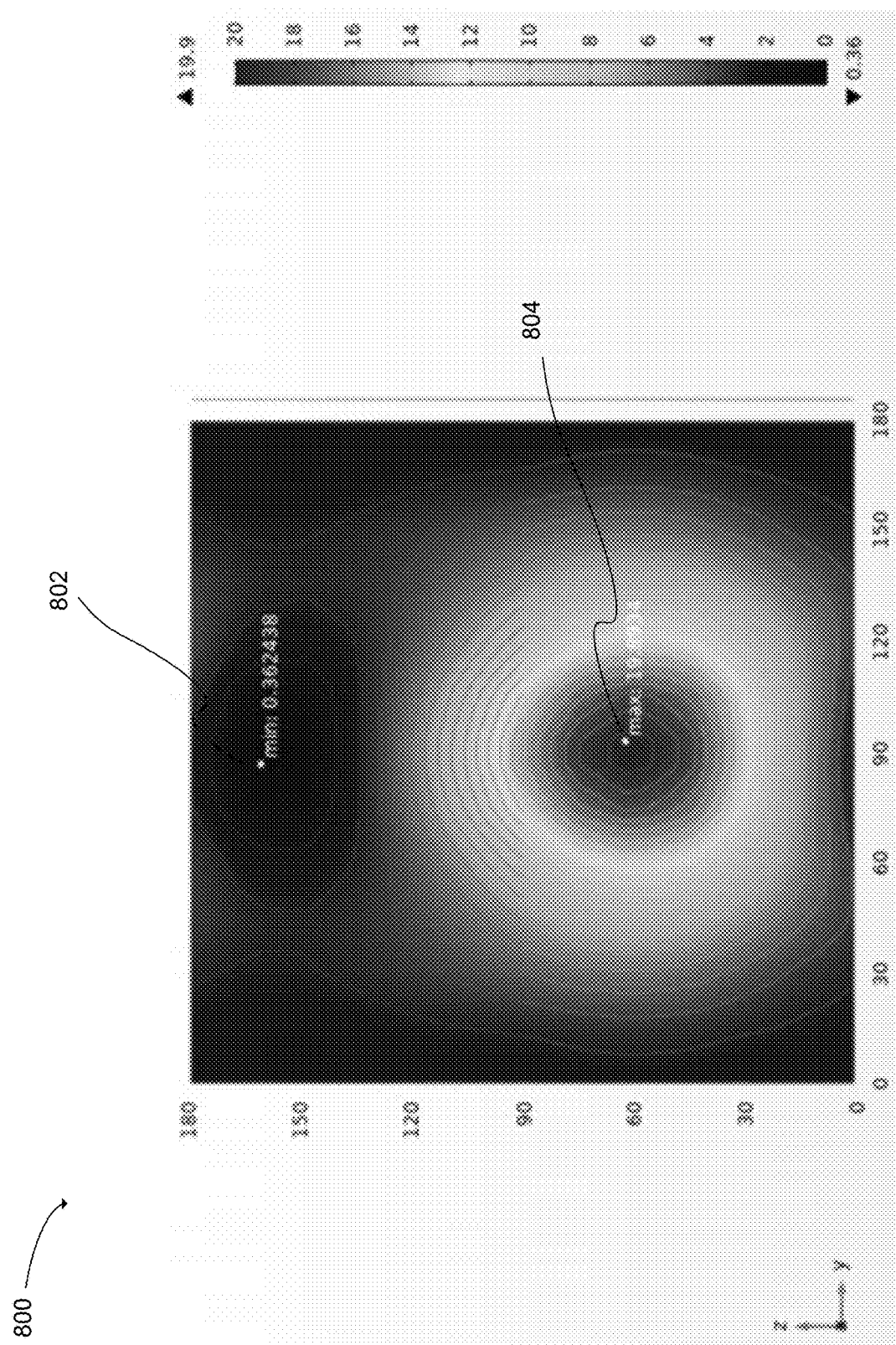
FIG. 8C is one of the 2-D Sezawa wave mode electromechanical coupling coefficient plot in FIG. 8B having a α of 30 degrees.

FIGS. 8A to 8C show plots of example simulation results of the Sezawa wave coupling coefficient values for all cuts of the LN piezoelectric layer 304. A 2-D model of SAW device 100 is used for all simulations described herein. The 2D model in the COMSOL Multiphysics software includes substrate surface and depth directions defined as x-y the plane assumes no change in wave properties in the direction perpendicular to the x-y plan (z-direction), therefore no SH waves are included in the model. FIG. 8A shows a three-dimensional plot of the electromechanical coupling coefficient values where all three cut angles α, β, γ (x, y, and z) are varied ranging from 0 to 180 degrees. FIG. 8B shows various cross sectional slices of the three dimensional plot shown in FIG.8A. As may be observed from FIG. 8A, the simulated SAW device, depending on the cut angles of the LN, may be capable of generating coupling coefficient of over 19%. The cross-sectional slices shown in FIG. 8B are two-dimensional plots of the coupling coefficient values at distinct α cut angles in 15 degree increments. One of such two dimensional coupling coefficient plots, namely plot 800 having α of 30 degrees, is shown in FIG. 8C. As noted on FIG. 8C, for α angle of 30 degrees, a minimum coupling coefficient value 802 of 0.362438% may be found at approximately β=90° (x-axis) and γ=165° (y-axis). A maximum coupling coefficient 804 with a value of 19.8934% is located at approximately β=90° (x-axis) and γ=60° (y-axis). Thus, a piezoelectric layer 304 in a multi-layer structured SAW device in accordance with the present disclosure comprising of LN of approximately (30°, 90°, 60°) may be capable of achieving a coupling coefficient of 19.89%. It is to be understood that although the α angle is shown in discrete 15 degree increments, they are made for illustration purposes and as the angles values may be continuous as shown in FIG. 8A. Hence, other cuts in between those discrete cross sectional plots in FIG. 8B may also be capable of generating similar Sezawa wave coupling coefficients. For example, a LN piezoelectric layer 304 with Euler angles (30°+/−15°, 90°+/−30°, 60°+/−30°), (90°+/−15°, 90°+/−30°, 120°+/−30°), and (150°+/−15°, 90°+/−30°, 60°+/−30°), are capable of generating coupling coefficient values of approximately 10%-19%. There may exists α angles in between 30 and 45 degrees that may be capable of generating similar coupling coefficient values and may be extracted from simulation results illustrated in FIG. 8A.

Figure 9A:
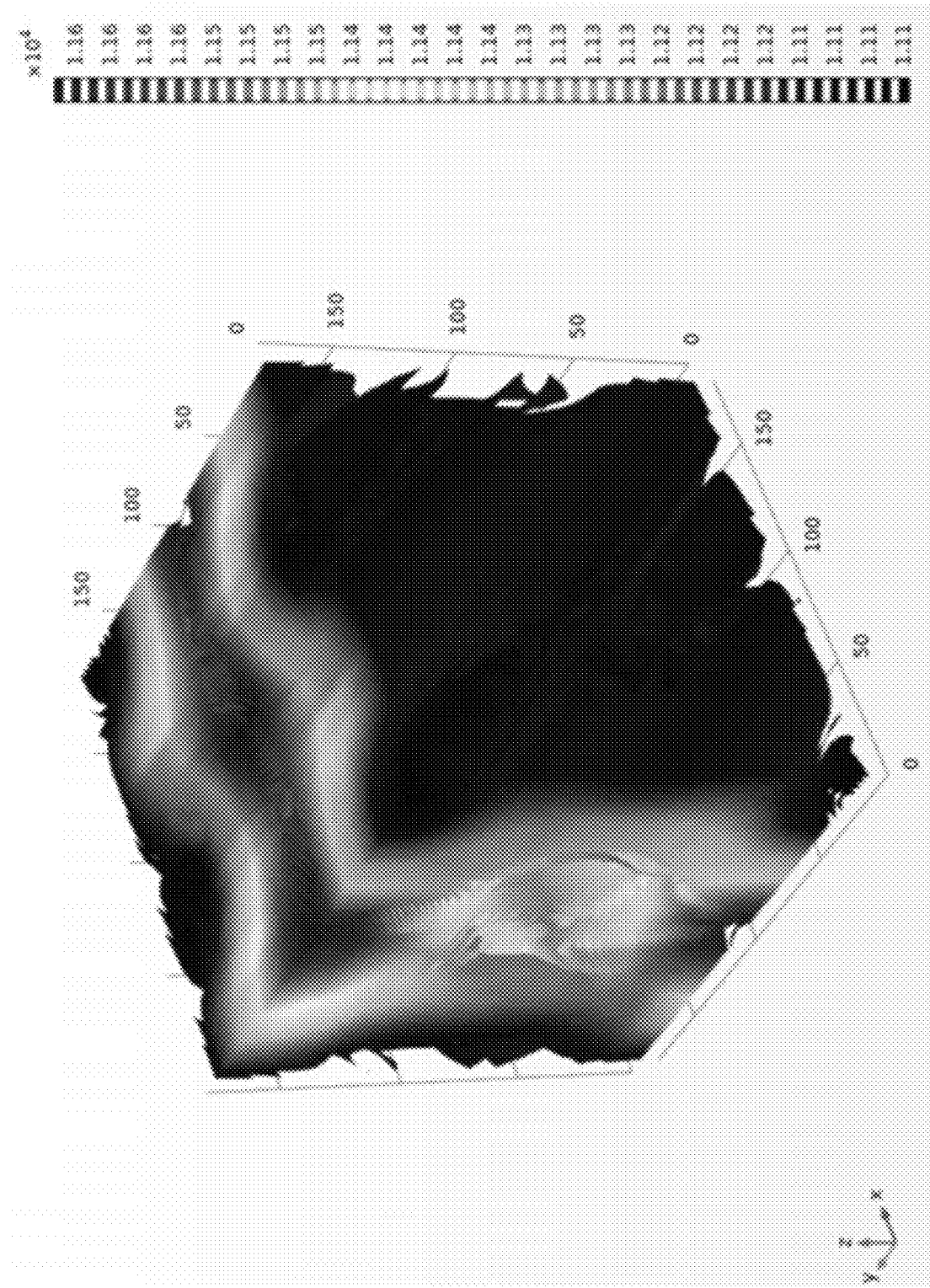
FIG. 9A is a 3-D Sezawa wave mode acoustic velocity plot of the SAW device in FIG. 3 for all cut angles of a LN piezoelectric layer.
Figure 9B:
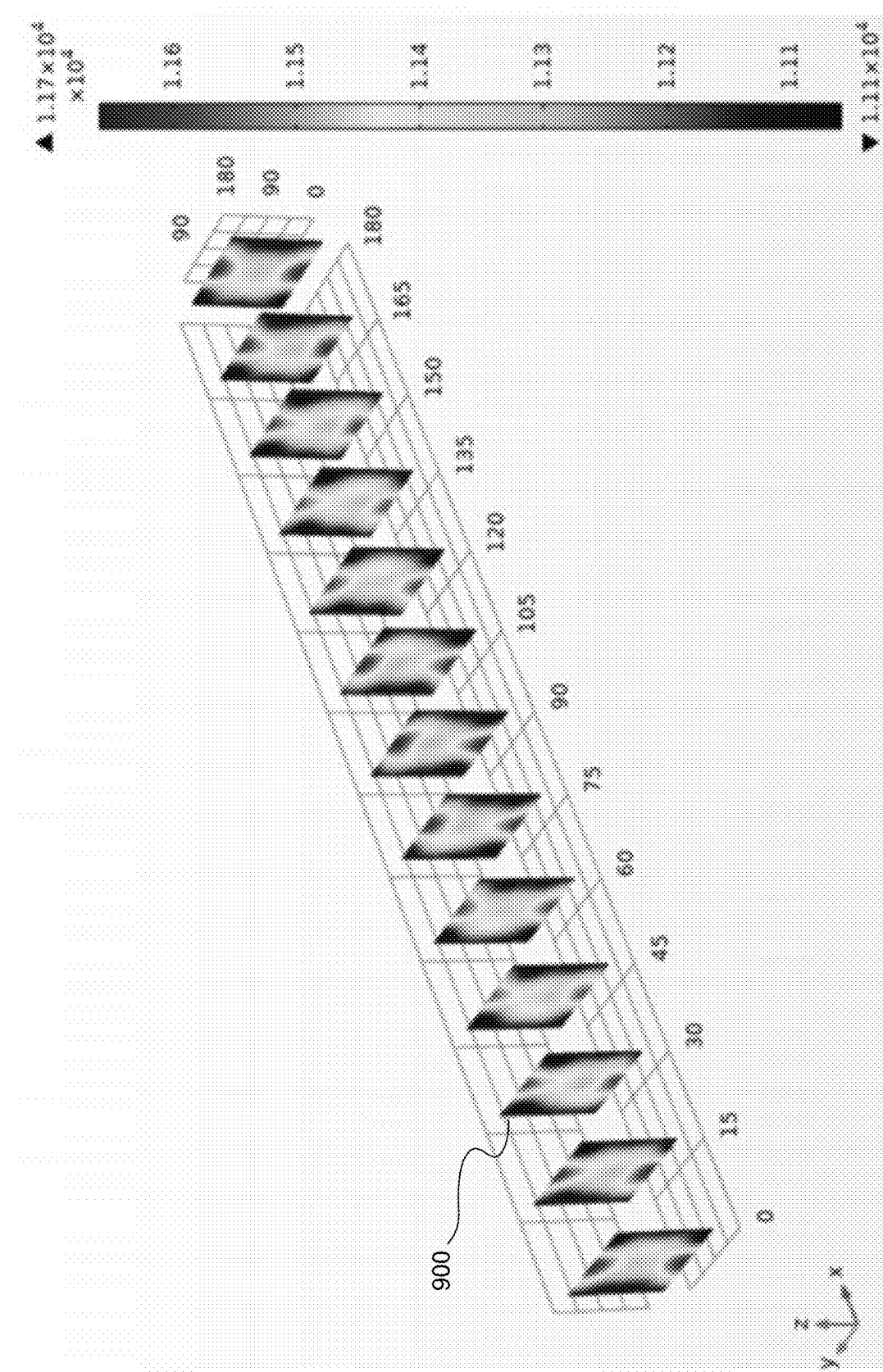
FIG. 9B illustrates various cross-sectional 2-D plots of the 3-D Sezawa wave mode acoustic velocity plot in FIG. 9A at α cut angles in 15 degree increments.
Figure 9C:
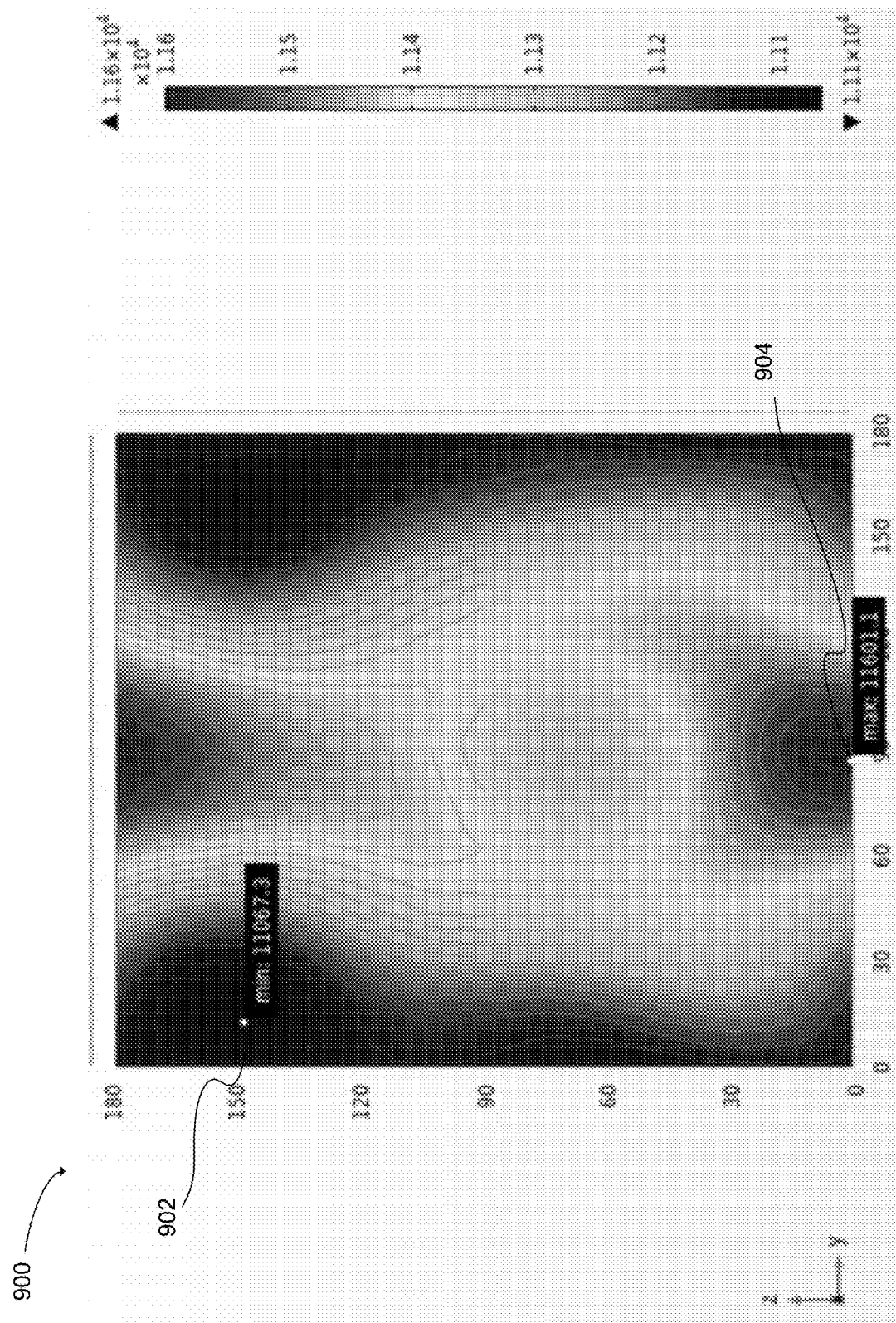
FIG. 9C is one of the 2-D Sezawa wave mode acoustic velocity plots in FIG. 9B having a α of 30 degrees.

Example simulation results of the Sezawa mode acoustic velocity for all cuts of the LN piezoelectric layer 304 in the above described simulated SAW device are shown in FIGS. 9A, 9B, and 9C. FIG. 9A shows a three dimensional plot of the acoustic velocity values of the LN piezoelectric layer 304 where all three cut angles α, β, γ, shown as x, y, and z, are varied between 0 and 180 degrees. FIG. 9B shows the various cross sectional slices of the three dimensional plot in FIG. 9A at discrete 15 degree α angle intervals. One of such two dimensional plots 900 is shown in FIG. 9C. As noted on FIG. 9C, for α angle of 30 degrees, a minimum acoustic velocity value 902 of 11067.3 m/s may be found at approximately β=15° (x-axis) and γ=150° (y-axis). A maximum acoustic velocity 804 with a value of 11601.1 m/s is located at approximately β=90° (x-axis) and γ=0° (y-axis). Thus, a piezoelectric layer 304 in a multi-layer structured SAW device in accordance with the present disclosure comprising of LN (30°, 90°, 0°) may be capable of achieving an acoustic velocity of 11601.1 m/s. LN piezoelectric layer 304 in the above described multilayer structure with Euler angles (30°+/−15°, 90°+/−30°, 60°+/−30°), (90°+/−15°, 90°+/−30°, 120°+/−30°), and (150°+/−15°, 90°+/−30°, 60°+/−30°), is capable of achieving an acoustic wave velocities of approximately 11300 m/s-11400 m/s.

Figure 10A:
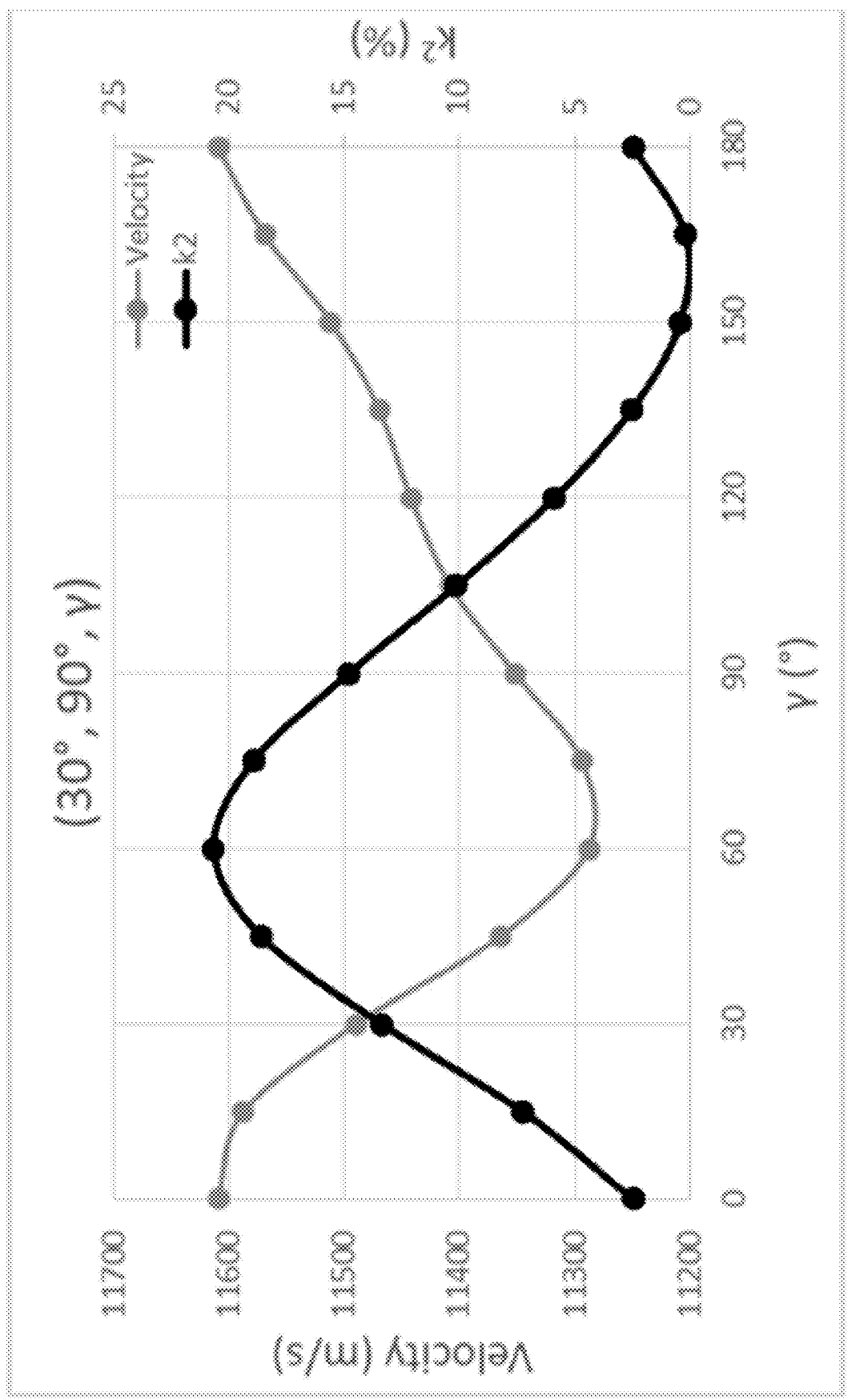
FIG. 10A and FIG. 10B show plots of the Sezawa wave mode electromechanical coupling coefficient and acoustic velocity of the SAW device in FIG. 3 each having a piezoelectric layer of a cut angle with two fixed Euler angle values of interest.
Figure 10B:
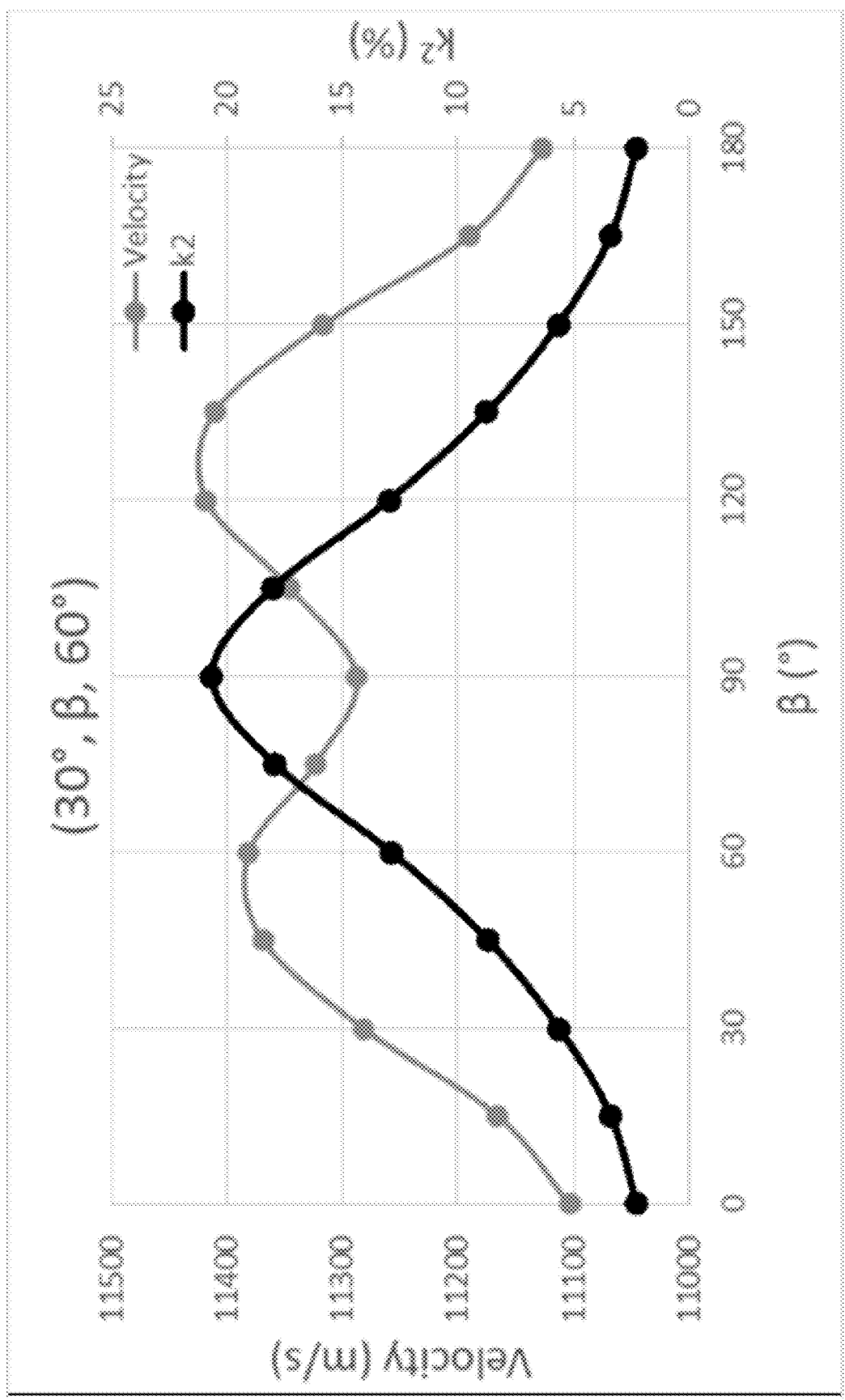

In FIGS. 10A and 10B, the coupling coefficient and the acoustic velocity simulation results are overlapped for cuts where at least two of the Euler angles are fixed values for clarity and illustration purposes. In FIGS. 10A and 10B, the fixed angle values may related to angle values that provides desirable SAW device characteristics such as high coupling coefficient and/or acoustic velocity as may be discerned from FIGS. 8A, 8B, 8C, 9A, 9B, and 9C. However, the Euler angle parameter may be set for any value to show a relationship between coupling coefficient and velocity, or any other analysis SAW device parameters that may assist in selection of cut of piezoelectric material. For example, LN of approximately (30°, 90°, 60°) may be capable of providing a coupling coefficient of 19.89% as shown in FIG. 8C, and LN (30°, 90°, 0°) may be capable of providing an acoustic velocity of 11601.1 m/s as shown in 9C. Both of foregoing LN cuts have α=30° and β=90° in common. Therefore, the α and β angles may be fixed at such values to determine an y angle value that provides the best compromise between high acoustic velocity and high coupling coefficient as shown in FIG. 10A. Depending on design specifications, suitable cuts of LN may be selected. In the illustrated embodiment, LN (30°, 90°, 60°) is capable of providing coupling coefficient of approximately 20% with an acoustic velocity of approximately 11,300 m/s. Any cut selection to improve the acoustic velocity would result in marginal gains while compromising the coupling coefficient value significantly. For example, the maximum acoustic velocity that may be achieved by LN (30°, 90°, γ) is approximately 11,600 m/s, a less than 3% increase from the cut that provides the maximum coupling coefficient. However, even a 100 m/s increase in acoustic velocity, for example at approximately γ=105° would lead to a 50% decrease in coupling coefficient to 10%. Alternatively, since acoustic velocity variation is minimal, the two of the Euler angle parameters may be fixed at values related to achieving high coupling coefficient. For example, in FIG. 10B, given that LN (30°, 90°, 60°) is capable of providing coupling coefficient of approximately 20%, the angles α may be set to 30° and γ set to 60°, to see if there's a α β angle value that may provide high coupling coefficient and acoustic velocity. In FIG. 10B, β angles between 0 to 60 and 120 to 180 may be suboptimal as it may be possible to select cuts that improves both coupling coefficient and acoustic velocity. Between β angle values of 60 to 120, the coupling coefficient and acoustic velocity exhibits an inverse relationship where design trade-offs may be necessary. Once again, the acoustic velocity in the 60 to 120 β angle region shows an approximately 1% in variation that is approximately 100 m/s to 150 m/s. However, the coupling coefficient in the 60 to 120 β angle region may vary from 13% to 21%. Thus, it may be preferable to select a cut, such as LN (30°, 90°, 60°), that maximizes the coupling coefficient with a slight decrease in acoustic velocity.

Figure 11A:
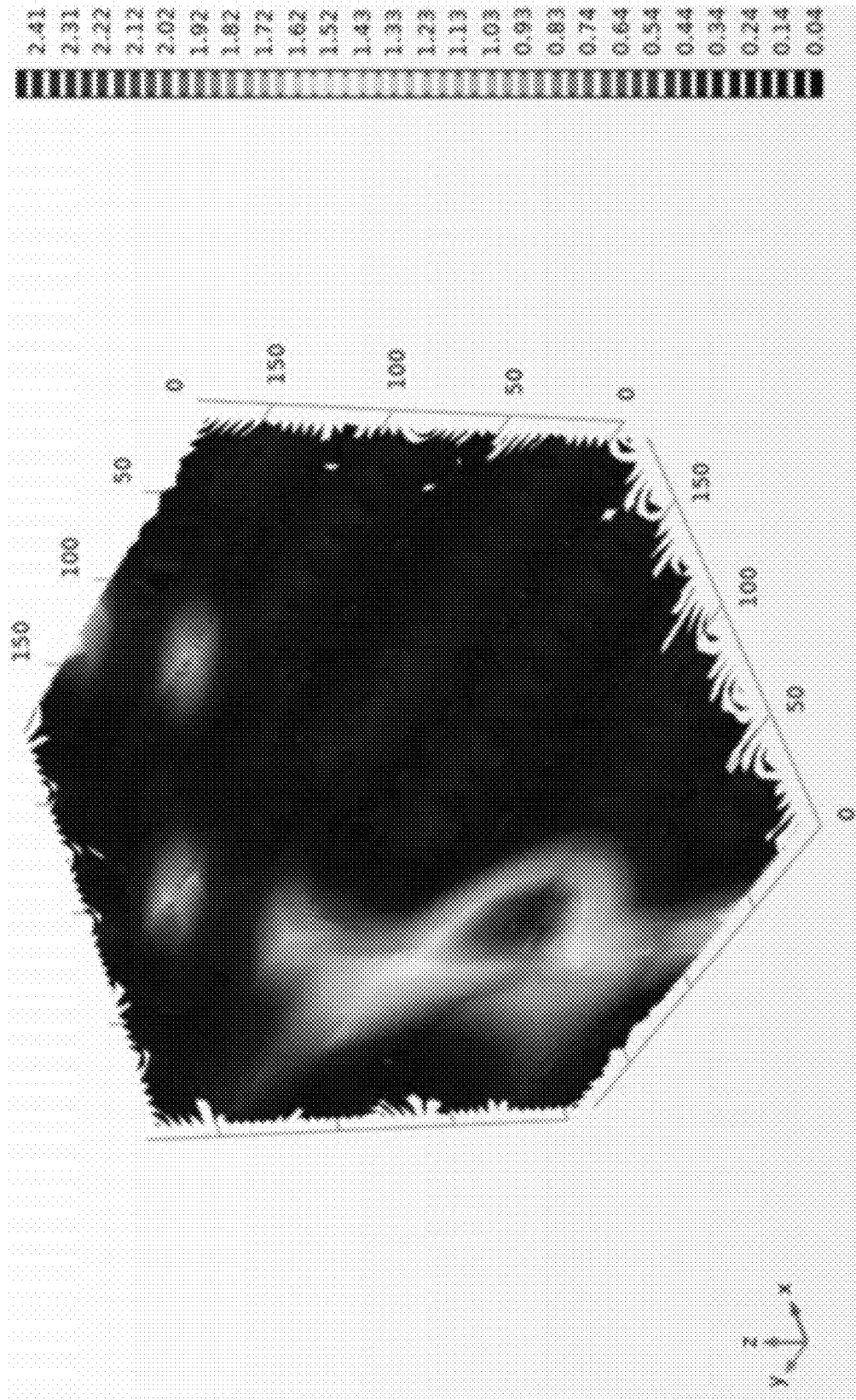
FIG. 11A is a 3-D Rayleigh wave mode electromechanical coupling coefficient plot of the SAW device in FIG. 3 for all cut angles of a LN piezoelectric layer.
Figure 11B:
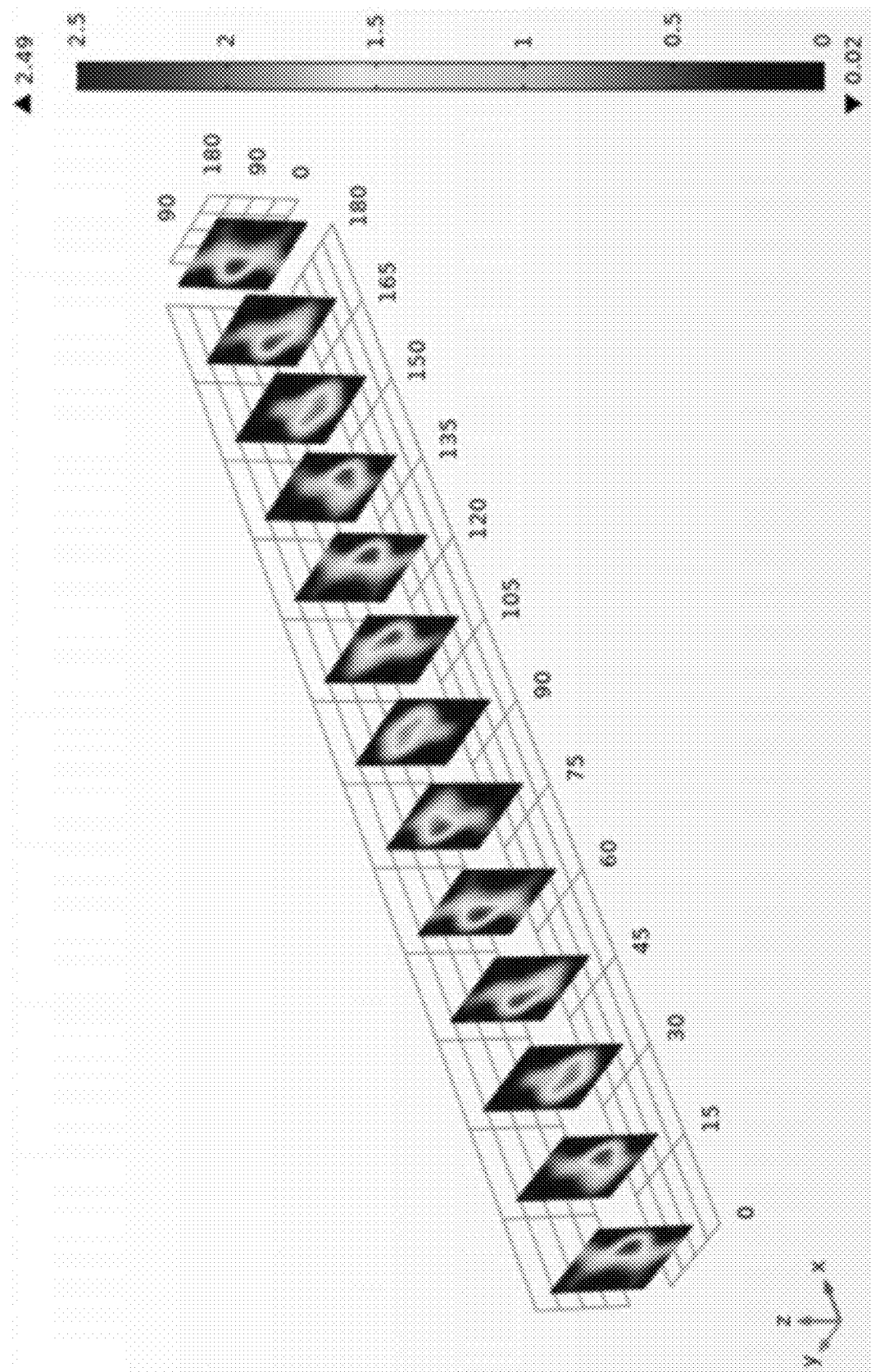
FIG. 11B illustrates various cross-sectional 2-D plots of the 3-D Rayleigh wave mode electromechanical coupling coefficient plot in FIG. 11A at α cut angles in 15 degree increments.

By comparison, the Rayleigh wave electromechanical coupling coefficient simulation results are shown in FIGS. 11A and 11B. FIG. 11A shows a three-dimensional plot of the coupling coefficient values as all three cut angles are varied from 0 to 180 degrees. FIG. 11B shows two-dimensional cross-section plots of the three-dimensional plot in FIG. 11A at discrete 15 degree α angle intervals. As it may be observed from FIGS. 11A and 11B, the simulated multi-layer structured SAW device exhibits Rayleigh wave mode coupling coefficient values of less than 2.50%, which is significant lower than the approximately 20% coupling coefficient values provided by the Sezawa wave mode.

Figure 12A:
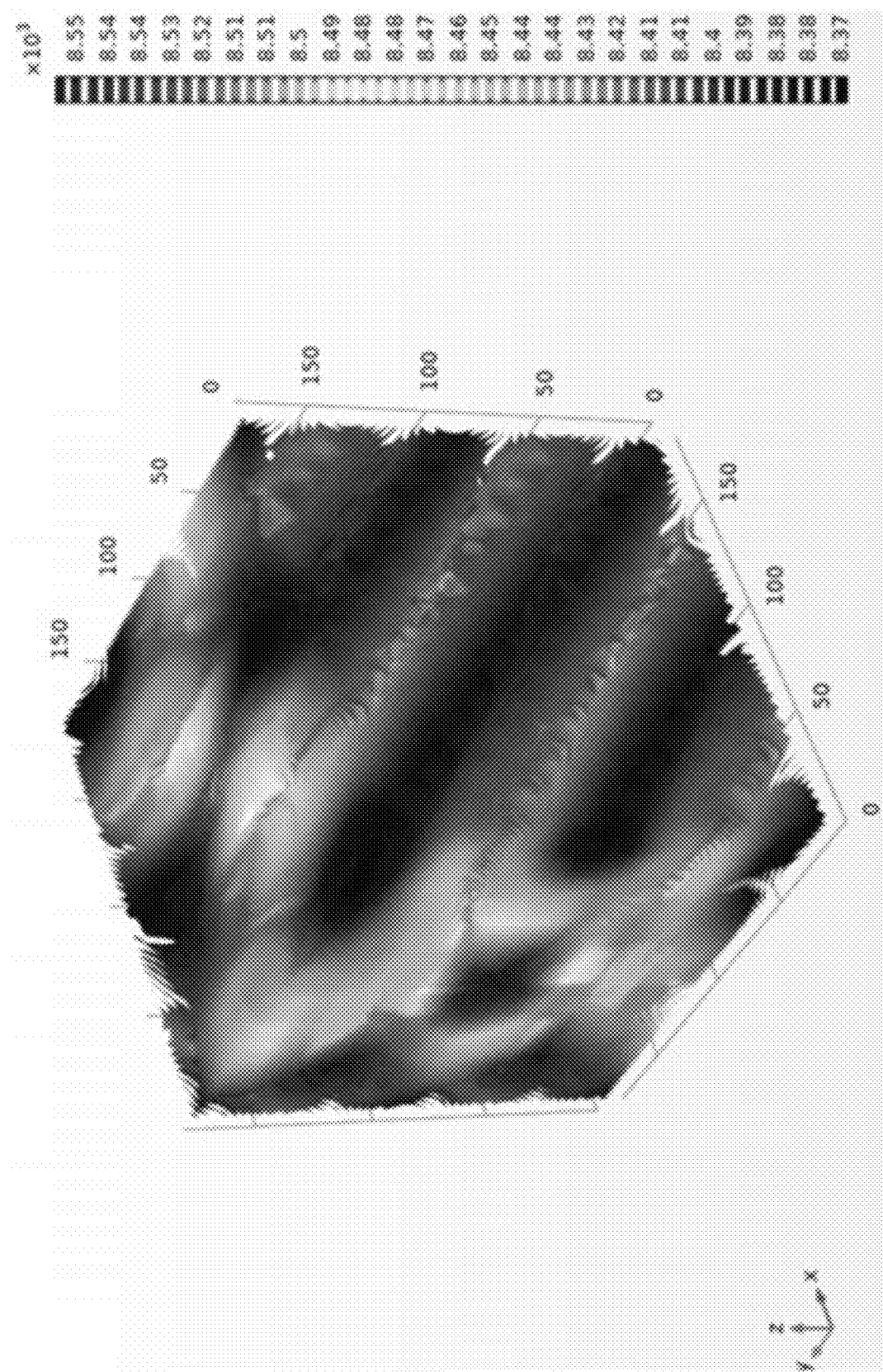
FIG. 12A is a 3-D Rayleigh wave mode acoustic velocity plot of the SAW device in FIG. 3 for all cut angles of a LN piezoelectric layer.
Figure 12B:
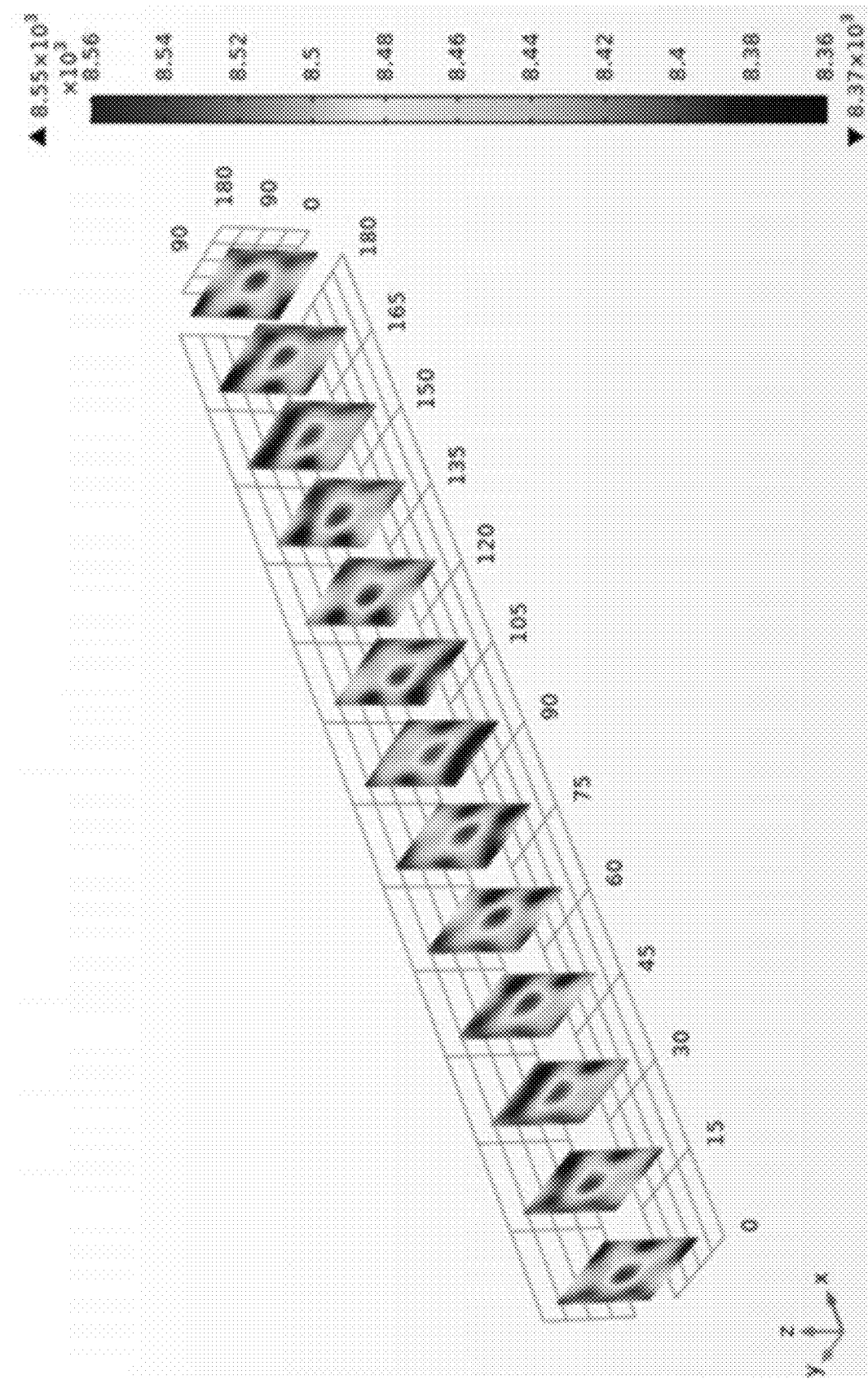
FIG. 12B illustrates various cross-sectional 2-D plots of the 3-D Rayleigh wave mode acoustic velocity plot in FIG. 12A at α cut angles in 15 degree increments.

Example simulation results of the Rayleigh mode acoustic velocity for all cuts of the LN piezoelectric layer 304 of the same simulated SAW device are shown in FIGS. 12A and 12B. FIG. 12A shows a three-dimensional plot of the acoustic velocity values as all three cut angles are varied from 0 to 180 degrees. FIG. 12B shows two-dimensional cross-section plots of the three-dimensional plot in FIG. 12A at discrete 15 degree α angle intervals. As it may be observed from FIGS. 12A and 12B that the Rayleigh wave mode acoustic velocity for the simulated multi-layer structured SAW device does not exceed 8,560 m/s.

In some other embodiments, instead of having an equipotential layer such as a monolayer or few-layer graphene or borophene, the multi-layer structured SAW devices in accordance with the present disclosure may comprise an electrically open surface between the piezoelectric layer and the high acoustic velocity layer. This may reduce the time and cost of fabrication, and may simplify the wafer bonding process. An example embodiment of a SAW device 1300 in accordance with the present disclosure is shown in FIG. 13. The multi-layered body 102 of the SAW device 1300 may comprise three layers 1302: a base layer 1310, a high acoustic velocity layer 1308 (e.g. a diamond layer), and a piezoelectric layer 1304 (e.g. a LN layer). The IDT electrodes 108 may be located on a first surface of the piezoelectric layer 1304. The piezoelectric layer 1304 is directly bonded to the high acoustic velocity layer 1308, and the interface between the two layers defines the electrically open surface 1306.

Figure 14A:
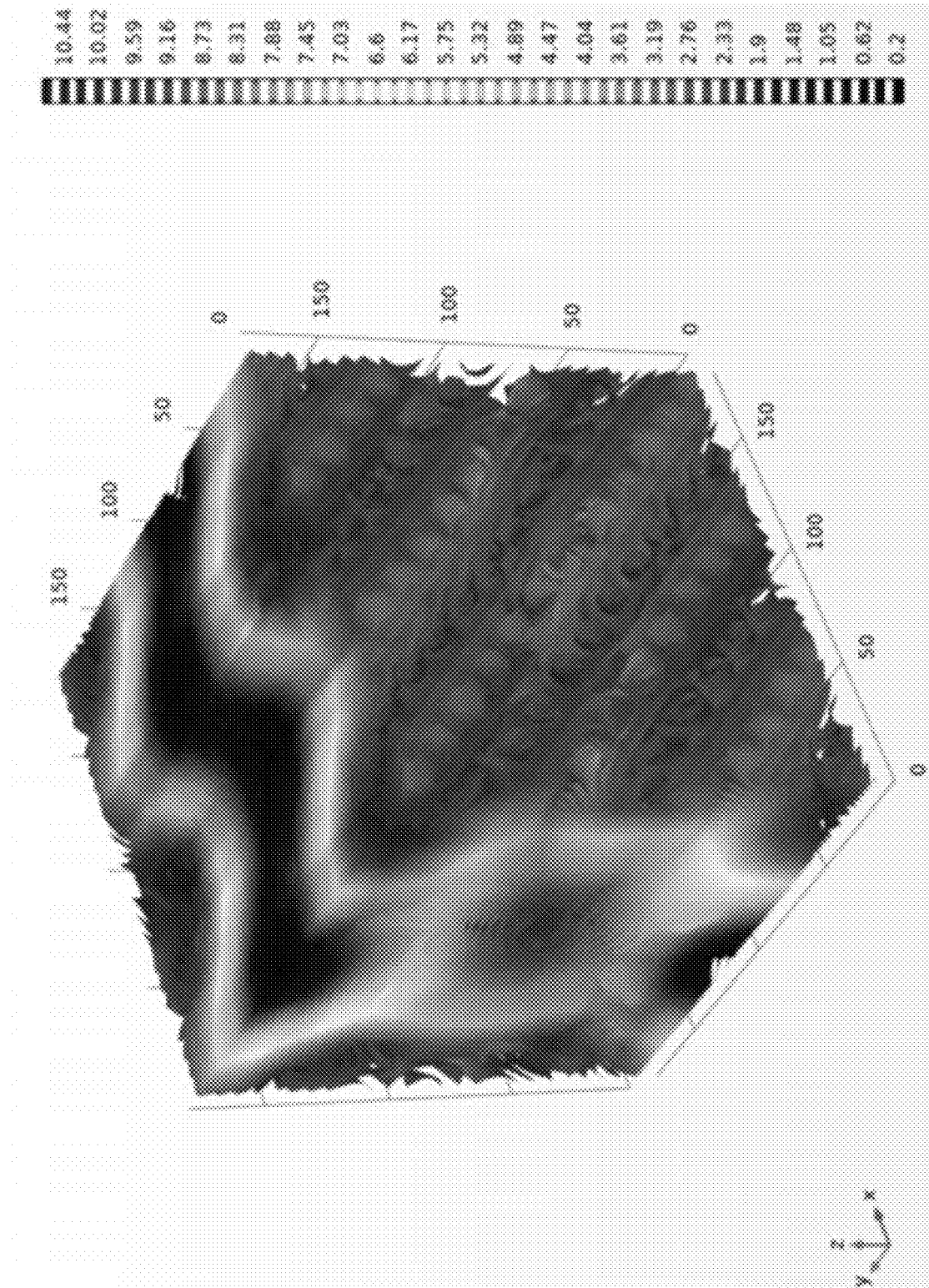
FIG. 14A is a 3-D Sezawa wave mode electromechanical coupling coefficient plot of the SAW device in FIG. 13 for all cut angles of a LN piezoelectric layer.
Figure 14B:
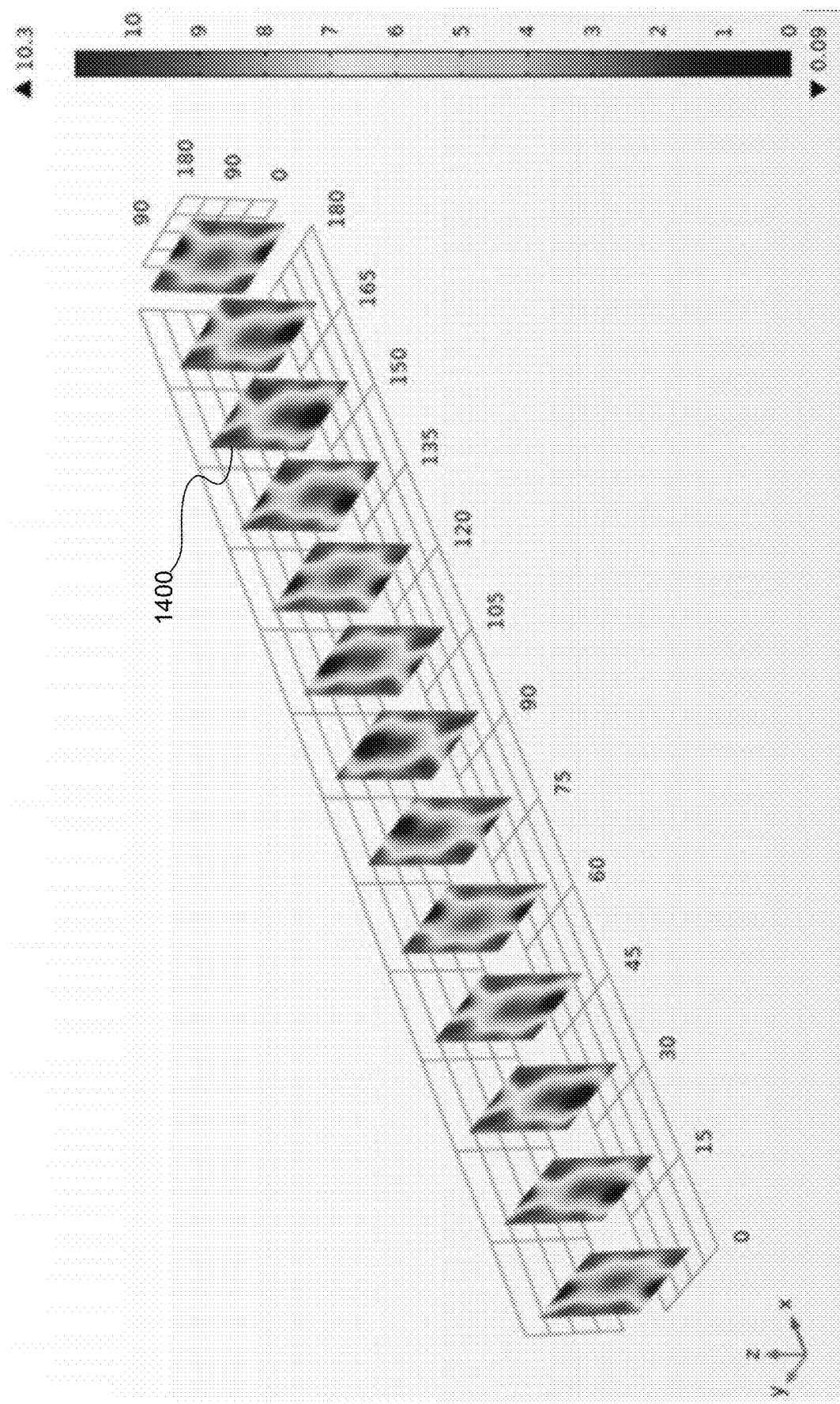
FIG. 14B illustrates various cross-sectional 2-D plots of the 3-D Sezawa wave mode electromechanically coupling coefficient plot in FIG. 14A at α cut angles in 15 degree increments.
Figure 14C:
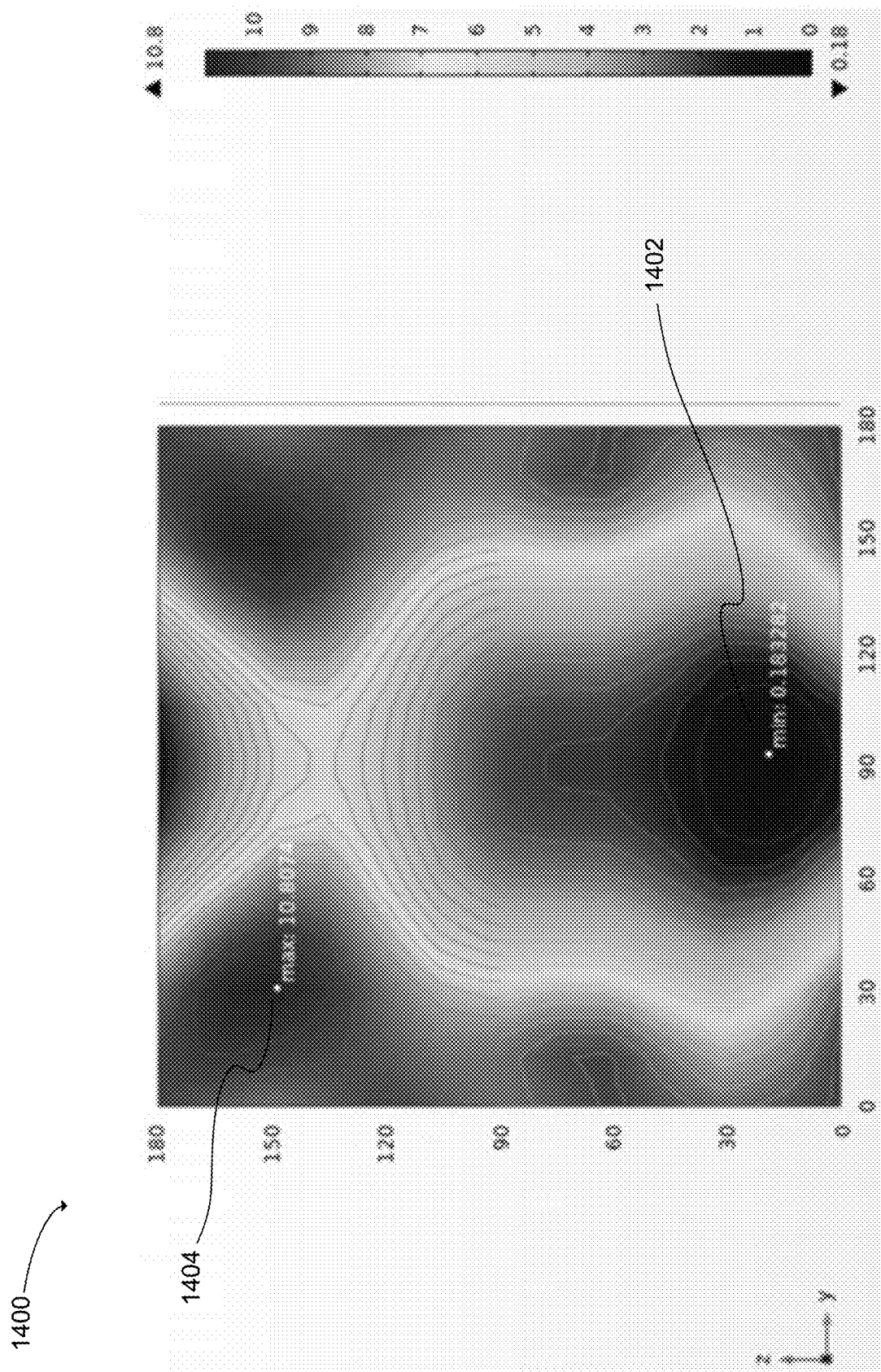
FIG. 14C is one of the 2-D Sezawa wave mode electromechanical coupling coefficient plot in FIG. 14B having a α of 150 degrees.

The anisotropic properties of the piezoelectric layer 1304 being separated from the high acoustic velocity layer 1308 by an open surface 1306 is simulated using COMSOL Physics. The simulated device comprises of ideal IDT thickness of 0λ, or in other words infinitesimally small thickness having high conductivity. A piezoelectric layer 1304 comprising of 0.1λ LN is used for simulation. The simulated device further comprises a diamond high acoustic velocity layer 1308 of 0.8λ set above a silicon base layer 1310. The interface between the LN piezoelectric layer 1304 and the diamond high acoustic velocity layer 1308 is set to be an open surface. Example simulation results of the Sezawa mode coupling coefficient for all cuts of the LN piezoelectric layer 1304 are shown in FIGS. 14A, 14B, and 14C. FIG. 14A shows a three dimensional plot of the coupling coefficient values of the LN piezoelectric layer 1304 where all three Euler cut angles α, β, γ, shown as x, y, and z, are varied between 0 and 180 degrees. FIG. 14B shows the various cross sectional slices of the three dimensional plot in FIG. 14A at discrete 15 degree α angle intervals. One of such two dimensional plots 1400 at α=150°, which appears to contain a high coupling coefficient value, is shown in FIG. 14C. As noted on FIG. 14C, for α angle of 150 degrees, a minimum coupling coefficient value 1402 of 0.183282% may be found at approximately β=90° (x-axis) and γ=15° (y-axis). A maximum coupling coefficient value 1404 with a value of 10.8074% is located at approximately β=30° (x-axis) and γ=150° (y-axis). Thus, a piezoelectric layer 1304 in a multi-layer structured SAW device in accordance with the present disclosure comprising of LN (150°, 30°, 150°) may be capable of achieving a coupling coefficient of 10.8074%. It is to be understood that α angle of 150 degrees is selected for illustrative purposes, and that other angles, whether shown in FIG. 14B or not, are capable of providing the maximum coupling coefficient value for SAW device 1300 as may be found from the data that generated FIG. 14A.

Figure 15A:
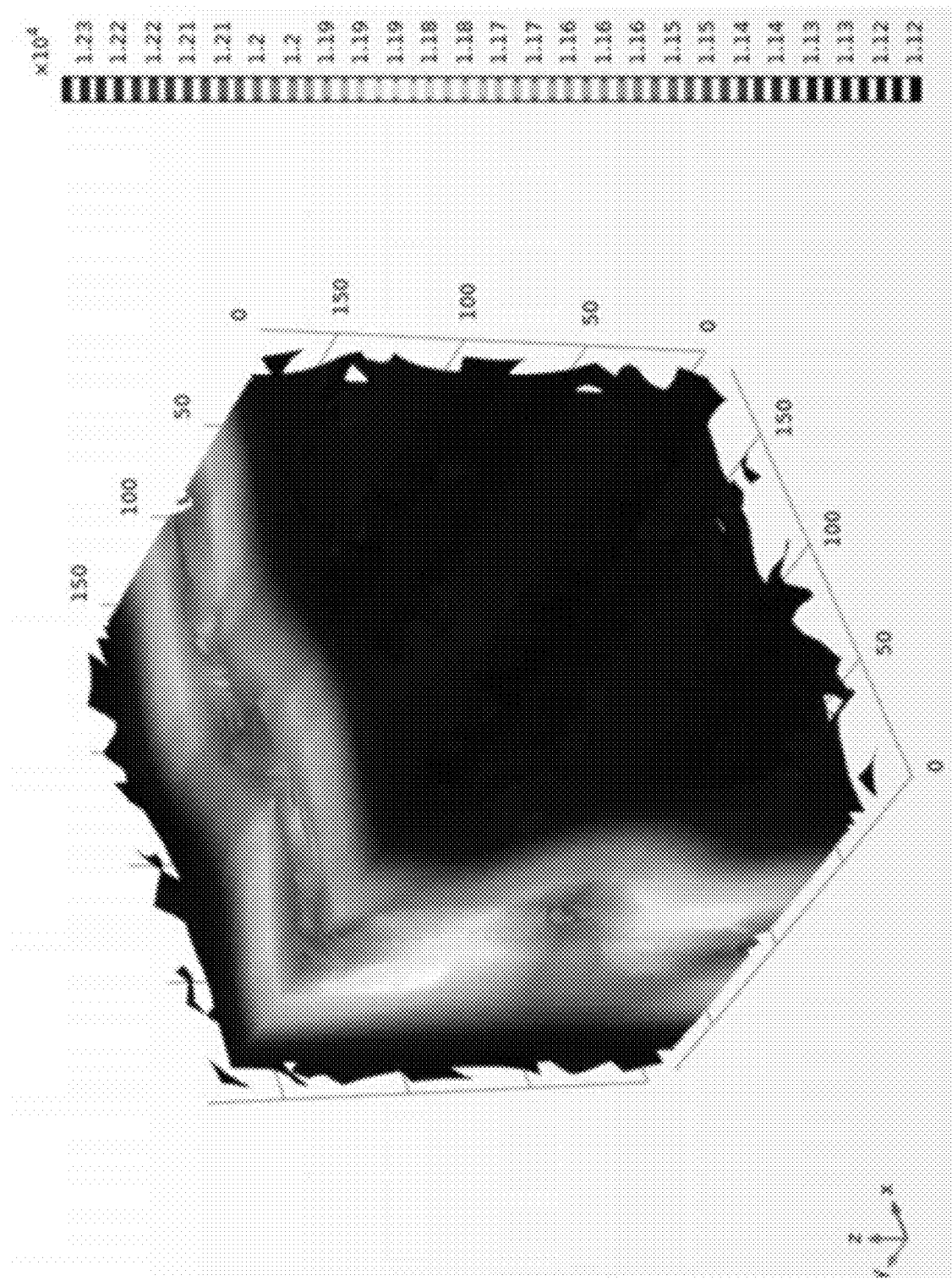
FIG. 15A is a 3-D Sezawa wave mode acoustic velocity plot of the SAW device in FIG. 13 for all cut angles of a LN piezoelectric layer.
Figure 15B:
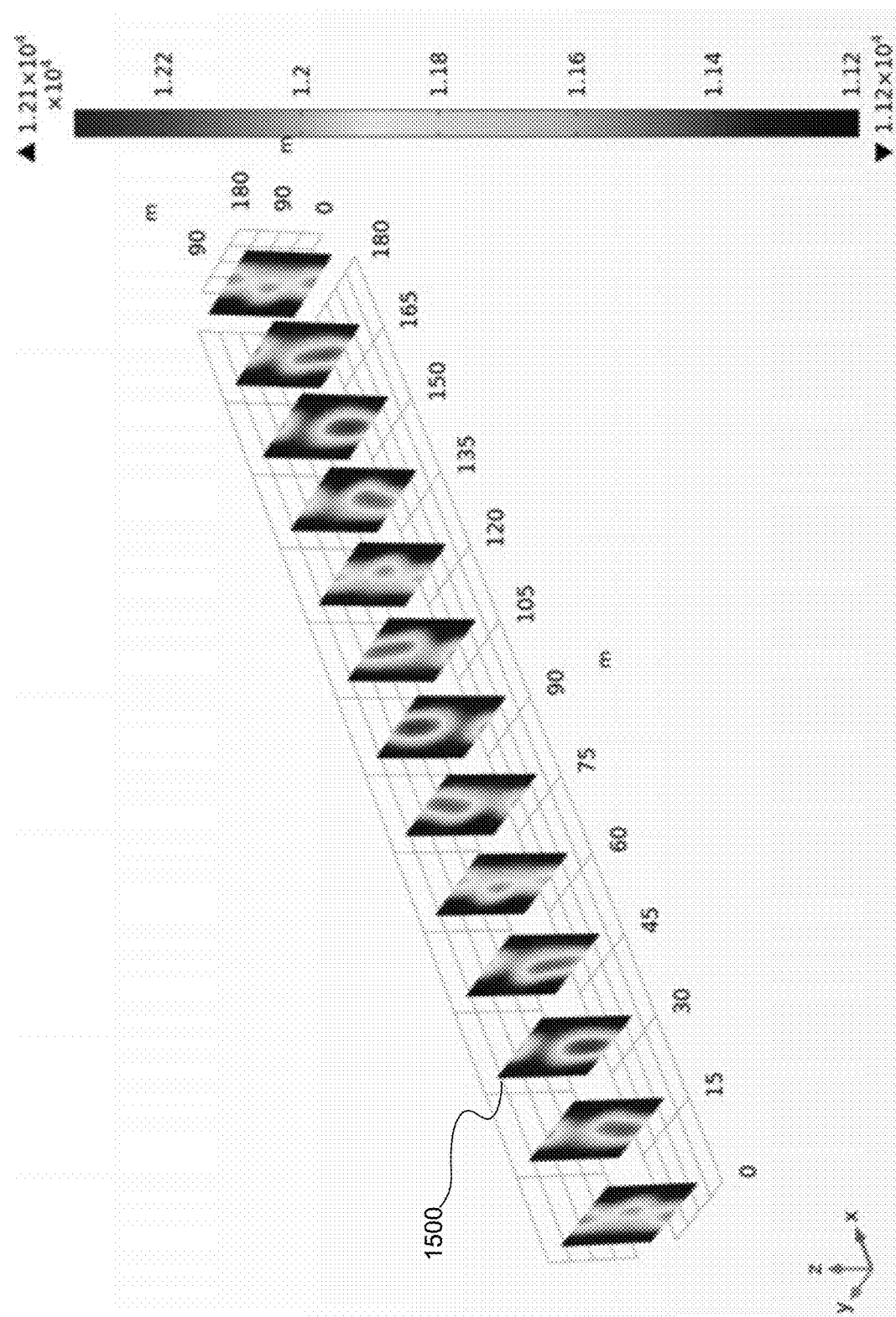
FIG. 15B illustrates various cross-sectional 2-D plots of the 3-D Sezawa wave mode acoustic velocity plot in FIG. 15A at α cut angles in 15 degree increments.
Figure 15C:
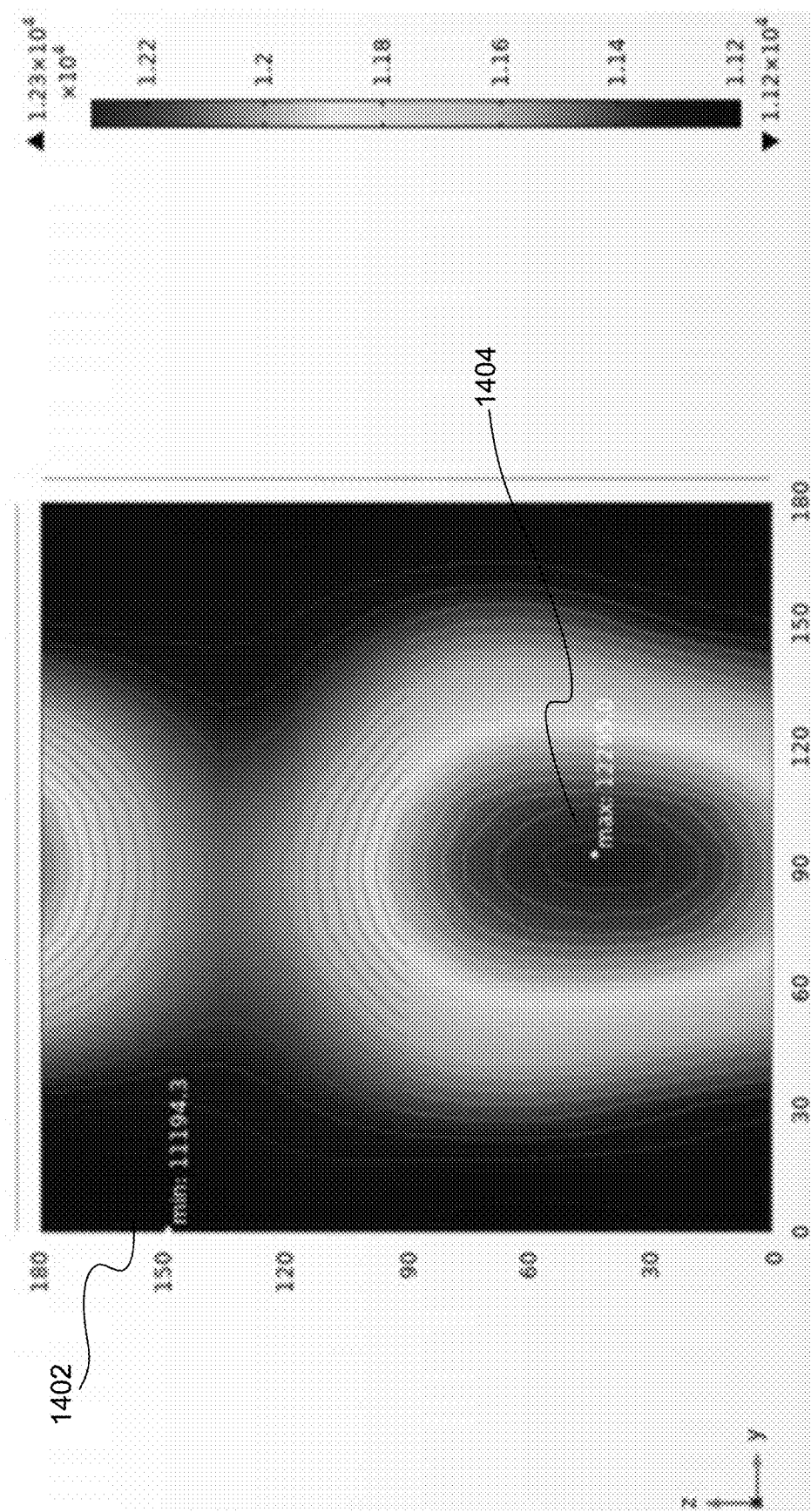
FIG. 15C is one of the 2-D Sezawa wave mode acoustic velocity plots in FIG. 15B having a α of 30 degrees.

Example simulation results of the Sezawa mode acoustic velocity for all cuts of the LN piezoelectric layer 1304 in the above described simulated SAW device 1300 are shown in FIGS. 15A, 15B, and 15C. FIG. 15A shows a three dimensional plot of the acoustic velocity values of the LN piezoelectric layer 1304 where all three cut angles α, β, γ, shown as x, y, and z, are varied between 0 and 180 degrees. FIG. 15B shows the various cross sectional slices of the three dimensional plot in FIG. 15A at discrete 15 degree α angle intervals. One of such two dimensional plots 1500 at α angle 30 degrees, which appears to contain high acoustic velocity values, is shown in FIG. 15C. As noted on FIG. 15C, for α angle of 30 degrees, a minimum acoustic velocity value 1502 of 11194.1 m/s may be found at approximately β=0° (x-axis) and γ=150° (y-axis). A maximum acoustic velocity 1504 with a value of 12295.0 m/s is located at approximately β=90° (x-axis) and γ=45° (y-axis). Thus, a piezoelectric layer 1304 in a multi-layer structured SAW device in accordance with the present disclosure comprising of LN (30°, 90°, 45°) may be capable of achieving an acoustic velocity of 12295 m/s. Similarly, it is to be understood that α angle of 30 degrees is selected for illustrative purposes, and that other angles, whether shown in FIG. 15B or not, are capable of providing the maximum acoustic velocity value for SAW device 1300 as may be found from the data that generated FIG. 15A.

Figure 16A:
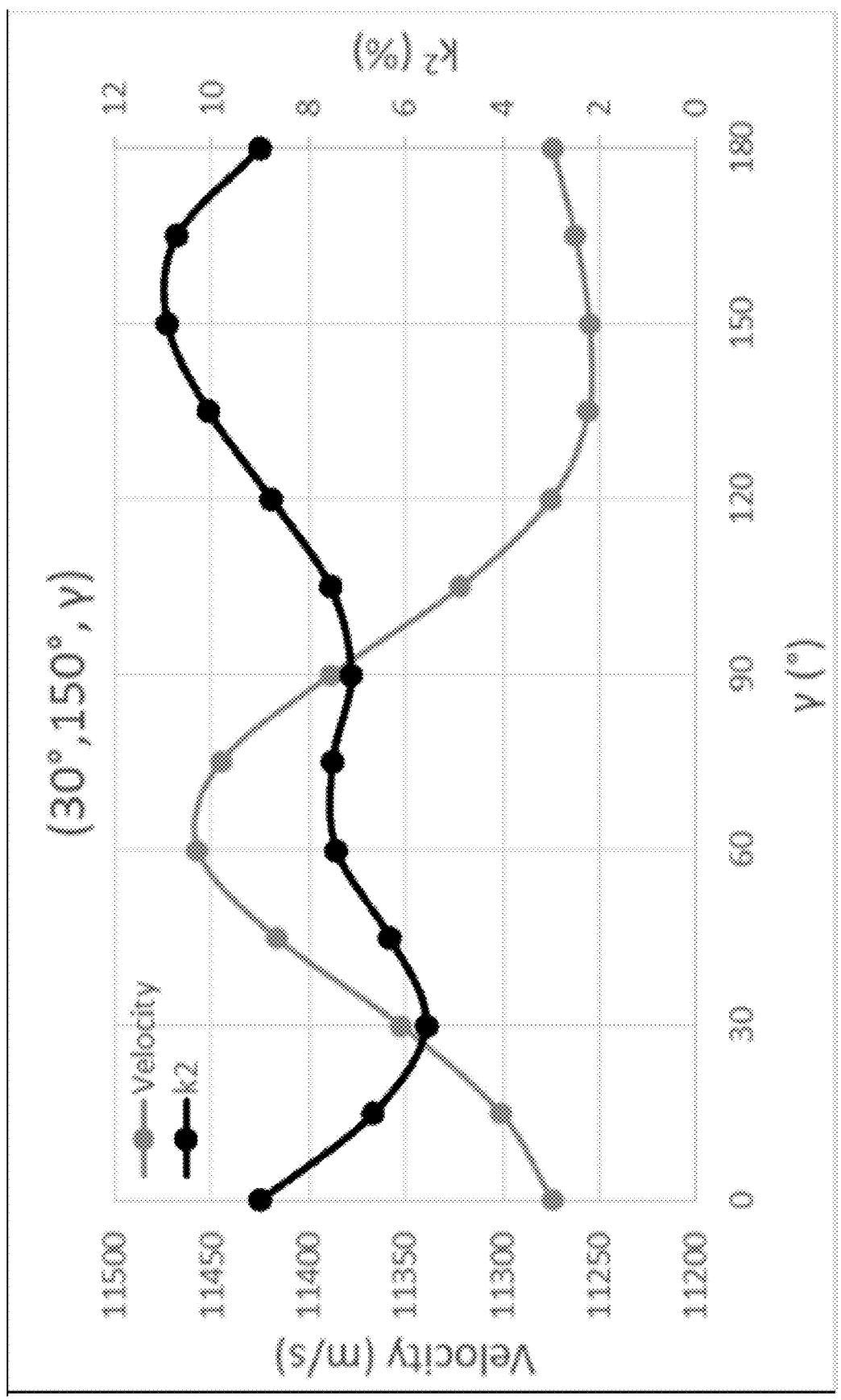
FIGS. 16A and 16B show plots of the Sezawa wave mode electromechanical coupling coefficient and acoustic velocity of the SAW device in FIG. 13 each having a piezoelectric layer of a cut angle with two fixed Euler angle values of interest.
Figure 16B:
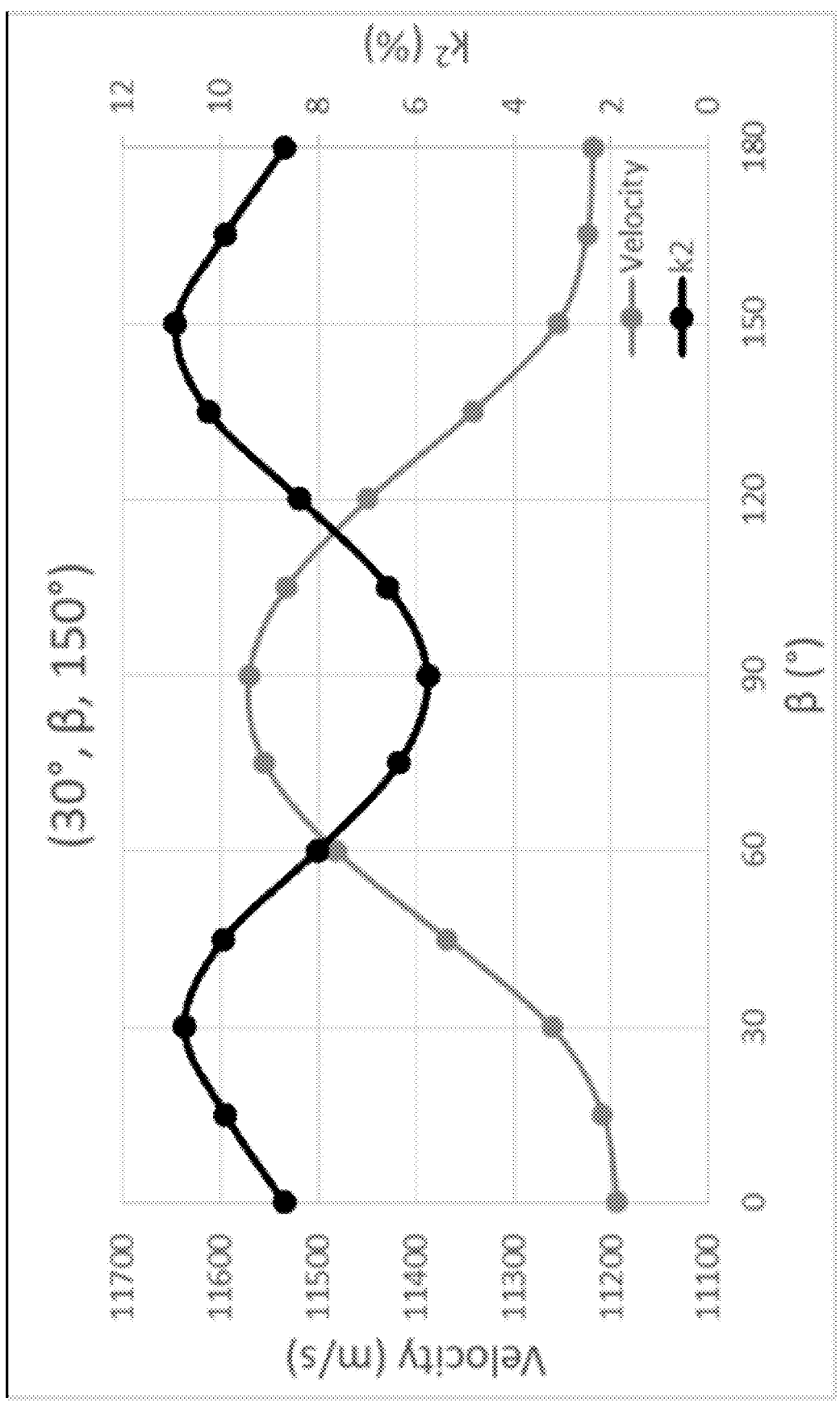

FIGS. 16A and 16B show the coupling coefficient and acoustic velocity correlations for cut angles LN (30°, 150°, γ) and LN ((30°, β, 150°), respectively. The fixed angle values may be selected similar to those described in relation to FIGS. 10A and 10B. LN cut selection trade-off between acoustic velocity value and coupling coefficient value considerations may be based on design criteria and may be similar to those described in relation to FIGS. 10A and 10B. For example, it may be preferred to select LN (30°, 150°, 150°) to maximize coupling coefficient value since the deviation in coupling coefficient value is much greater than that of the acoustic velocity value.

Figure 17A:
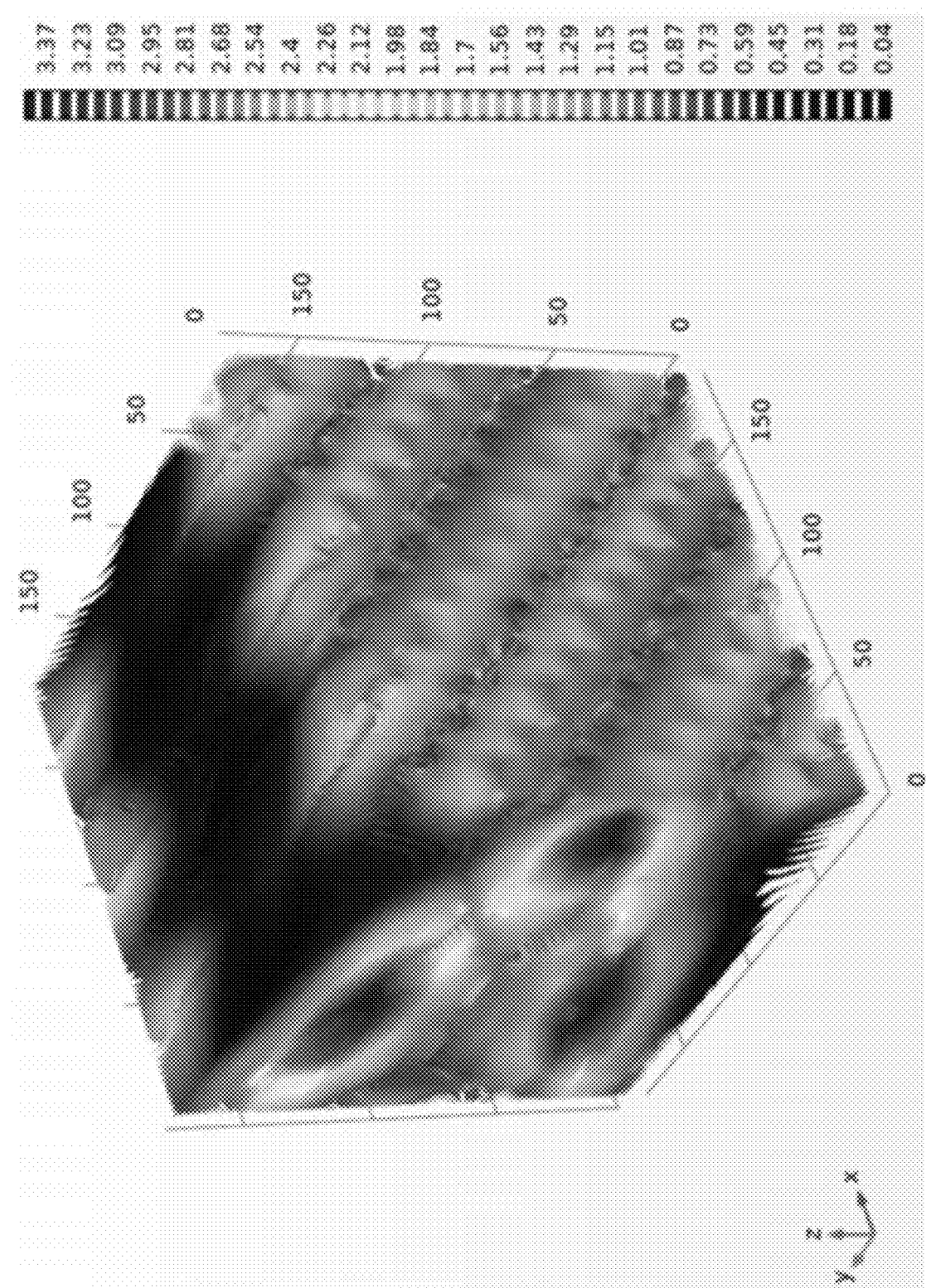
FIG. 17A is a 3-D Rayleigh wave mode electromechanical coupling coefficient plot of the SAW device in FIG. 13 for all cut angles of a LN piezoelectric layer.
Figure 17B:
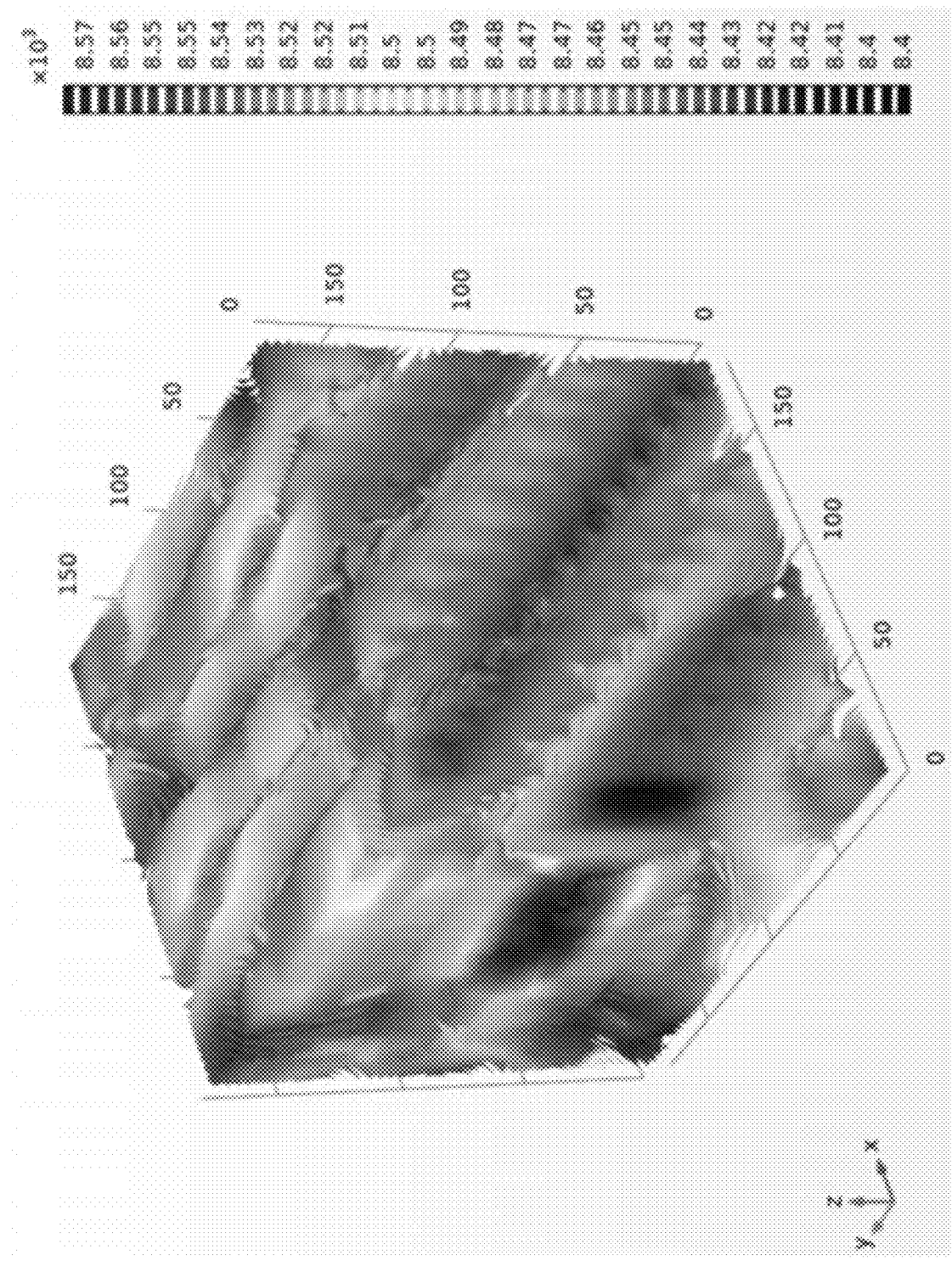
FIG. 17B is a 3-D Rayleigh wave mode acoustic velocity plot of the SAW device in FIG. 13 for all cut angles of a LN piezoelectric layer.

By comparison, the three-dimensional plots of the Rayleigh wave coupling coefficient and acoustic velocity simulation results are shown in FIGS. 17A and 17B, respectively. As it may be observed from FIGS. 17A and 17B, the simulated multi-layer structured SAW device 1300 exhibits Rayleigh wave mode coupling coefficient values of less than 3.50%, and acoustic velocity values of less than 8,600 m/s, both of which are much lower than those of the Sezawa wave mode.

The base layer 310 may comprise a silicon substrate upon which the high acoustic velocity layer 308 may be grown or deposited on a first surface of the base layer 310. Although the base layer 310 and high acoustic velocity layer 308 described herein may be two separate layers, these two layers may be replaced by a single crystal diamond substrate or by high speed SiC substrate. In other example embodiments, the base layer 310 may not be silicon but may be another material, such as glass, that provides mechanical support for the high acoustic velocity layer 308. Silicon may be selected because it is a common substrate used in the semiconductor industry, a relatively low cost material, and/or a widely available material. Silicon may be replaced with other substrate materials as long as the high acoustic velocity layer 308 may be effectively grown on the base layer 310. In particular, for a diamond thin film, the silicon material may provide advantages over other types of materials.

Figure 18:
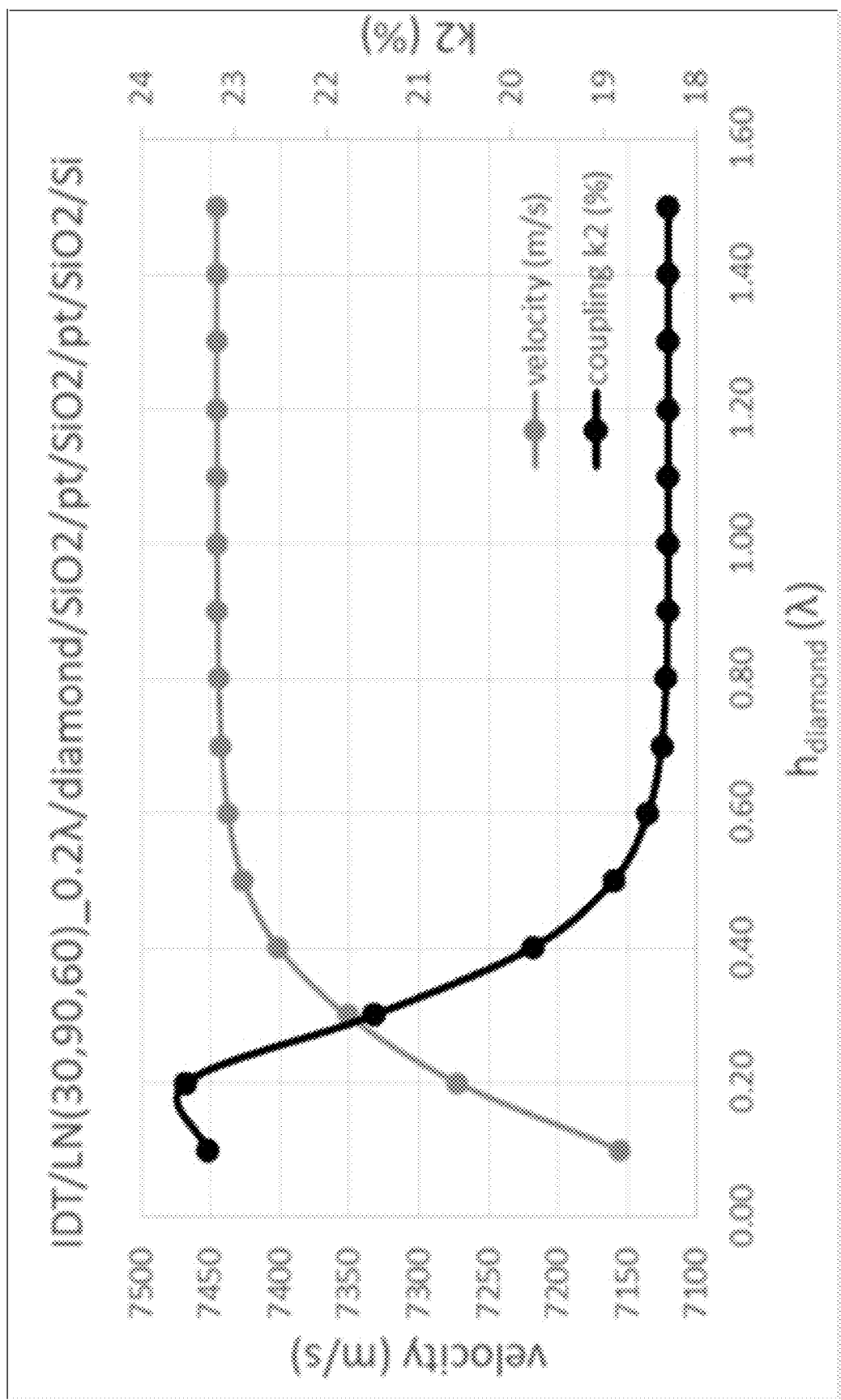
FIG. 18 is a plot of Sezawa wave mode electromechanical and acoustic velocity as a function of high acoustic velocity layer 308 thickness.

The high acoustic velocity layer 308 may enable a high acoustic velocity (e.g. 8,000 m/s to 10,000 m/s) for the SAW and may enable a high operating frequency according to Equation (1). Materials such as diamond, which has one of the highest acoustic velocities, may be a suitable material used for the high acoustic velocity layer 308. The thickness of the high acoustic velocity layer 308 is such that it may be viewed as being semi-infinite such that the base layer 310 has negligible impact on the wave propagation in the SAW device 300. FIG. 18 shows a plot of exemplary simulation results of Sezawa wave mode electromechanical coupling coefficient and acoustic velocity as a function of high acoustic velocity layer 308 thickness. The device under simulation is a multi-layered device similar to that of the Murata™'s IHP SAW where the multi-layer body includes alternating high and low impedance layers of SiO2 and platinum. A LN (30°, 90°, 60°) piezoelectric layer of 0.2λ is above a diamond high acoustic velocity layer, the thickness of which is varied. As may be observed from FIG. 18, the multilayer structure's physical properties, namely acoustic velocity and coupling coefficient, plateaus after diamond layer thickness of over 0.8λ. In other words, after a thickness of 0.8λ, the diamond layer thickness no longer affects the SAW device physical properties and the SAW device may have tolerance to diamond layer thickness manufacturing variances. From a fabrication point of view, the thicker the diamond layer, the longer the growth time, and hence the greater the fabrication cost. It is to be understood that for high acoustic velocity layer 304 materials other than diamond, the minimal thickness may vary accordingly.

An example manufacturing process for some of the example SAW filters discussed herein is generally described with reference to FIG. 19. In particular, the example method 1900 illustrated in FIG. 19 may be used for manufacture of multi-layer structured SAW device 300 as shown in FIG. 3. Common steps may be described once and differences may be indicated where applicable. Although certain techniques may be described below, any suitable thin film or semiconductor manufacturing techniques may be used.

A high resistive silicon substrate, such as, for example, a float-zone grown substrate, may be cleaned (step 1902) to provide the base layer 310.

For providing a high acoustic velocity layer, a multi-crystalline diamond thin film may be deposited or grown on the base layer 310 as a high acoustic velocity layer 308 or 1308 using chemical vapor deposition (CVD) at step 1904. The high acoustic velocity layer 308, 1308 may be grown to a suitable thickness such as for example 0.8λ so that the high acoustic velocity layer 308 appears to be infinite or semi-infinite to the SAW. The diamond layer may be polished and cleaned. The smoother the polished surface, the better the SAW propagation may be as the smoother surface may have less propagation loss. In some embodiments, diamond surface roughness of less than 0.5 nm root mean square (RMS) is needed to enable wafer-bonding piezoelectric layer onto it.

At step 1906, an equipotential layer 306 may be provided by any known methods on the high acoustic velocity layer 308. For example, if the equipotential layer 308 is made of graphene, the equipotential layer 306 may be formed by epitaxial growth (EG) of graphene layers to the desired number of layers (e.g. one atomic layer for a monolayer graphene). Other suitable methods of fabricating graphene may also include mechanical cleavage of graphite using adhesive tapes, chemical reduction of graphite oxide, epitaxial growth (EG) of graphene by thermal graphitization of SiC, chemical vapor deposition (CVD) of hydrocarbon gases on transition metals, exfoliation of graphite by sonication, quenching, and wet ball milling. If the equipotential layer 306 is made of borophene, the equipotential layer 306 may be formed by growth of borophene using a suitable growth process. If the equipotential layer 306 is made of metal (e.g., Cu), the equipotential layer 306 may be formed by deposition of the metal using any suitable deposition techniques. In some examples, the equipotential layer 306 may be omitted and hence 1906 may be omitted from the example method 1900. It is to be understood that the equipotential layer may be of other suitable materials, such as $SOCl_2$ doped few-layer graphene (i.e. 2 to 6 layers), which also has low sheet resistance (therefore very high electric conductivity), and corresponding methods of material deposition may be applied.

For providing the piezoelectric layer 304, ion implantation in single crystal piezoelectric material (e.g. LN, LT) may be used to define a desired thickness in the formed piezoelectric material by physically marking the formed piezoelectric layer 304. The piezoelectric layer 304 may be bonded to the equipotential layer 306, high acoustic velocity layer 308, and the base layer 310 using piezoelectric-on-insulator (POI) wafer bonding process for example at step 1908. The piezoelectric layer 304 may then be thermally split to the desired thickness as marked by ion implantation. The piezoelectric layer 304 may be further polished to obtain a smooth surface. In some other embodiments, after wafer bonding the piezoelectric layer 304, it is thinned by polishing to the desired thickness. It is to be understood that any other suitable method of piezoelectric layer 304 formation may be applied.

The IDT electrodes 108 are provided on a top surface of the piezoelectric layer 304, such as in the embodiment of FIG. 3, at step 1910. For example, if the IDT electrode 108 graphene, forming the IDT electrodes 108 may involve epitaxial graphene growth to the desired number of atomic layers (e.g. 1 atomic layer for a monolayer graphene or 2 to 10 layers for few-layer graphene). If the IDT electrode 108 is borophene, forming the IDT electrodes 108 may involve growing the borophene layer using a suitable growth process. Alternatively a layer of IDT material, such as a monolayer graphene, may be prepared by known methods and transported onto the smooth surface of the piezoelectric layer 304. Any other suitable method of providing IDT electrodes, such as those that may be used for depositing 2 to 6 layers of $SOCl_2$ doped graphene may also be applied. The IDT may be patterned, for example, using standard photolithography and/or direct e-beam writing technology. Additional conventional metal layer(s) may be used in the device wire bonding area, such as lead-out bonding pads 110, to facilitate the connection to the outside of the device.

Although the embodiments described herein disclose a SAW filter, the techniques herein may also be applied to other SAW devices including SAW resonators, duplexers, filters, or sensors. Some advantages described herein may benefit other SAW devices requiring high electromechanical coupling and/or using a Sezawa wave mode to function.

Although CVD may be described herein for growing a diamond layer, other embodiments may use any suitable deposition technique including, for example, plasma enhanced CVD (PECVD), hot filament CVD (HFCVD), or microwave plasma enhanced CVD (MPCVD). Single crystal diamond substrate may also use a high pressure, high temperature (HPHT) method.

The present disclosure may be embodied in other specific forms without departing from the subject matter of the claims. The described example embodiments are to be considered in all respects as being only illustrative and not restrictive. Selected features from one or more of the above-described embodiments may be combined to create alternative embodiments not explicitly described, features suitable for such combinations being understood within the scope of this disclosure. For examples, although specific sizes and shapes of IDT electrodes 108 are disclosed herein, other sizes and shapes may be used. In another example, although a particular SAW device 300 (e.g. filter) may be described herein, the structures described may be adapted to other SAW device configurations.

The dimensions described herein are meant to be illustrative and not restrictive. The figures may exaggerate or minimize the height of these layers for illustrative purposes and/or for ease of reference.

Although the example embodiments may be described with reference to a particular orientation (e.g. upper and lower surfaces), this was simply used as a matter of convenience and ease of reference in describing the figures.

Although the present disclosure describes methods and processes with steps in a certain order, one or more steps of the methods and processes may be omitted or altered as appropriate. One or more steps may take place in an order other than that in which they are described, as appropriate.

All values and sub-ranges within disclosed ranges are also disclosed. Also, although the systems, devices and processes disclosed and shown herein may comprise a specific number of elements/components, the systems, devices and assemblies could be modified to include additional or fewer of such elements/components. For example, although any of the elements/components disclosed may be referenced as being singular, the embodiments disclosed herein could be modified to include a plurality of such elements/components. The subject matter described herein intends to cover and embrace all suitable changes in technology.

The invention claimed is:

1. A surface acoustic wave device comprising:
    a base layer;
    a high acoustic velocity layer overlaying the base layer;
    an equipotential layer of a substantially two-dimensional (2D) conductive material overlaying the high acoustic velocity layer;
    a piezoelectric layer overlaying the equipotential layer, the piezoelectric layer formed from a single crystal material and having a first surface and an opposing second surface; and
    at least one transducer formed on the first surface of the piezoelectric layer, wherein the at least one transducer comprises a plurality of interdigital transducer (IDT) electrodes configured to propagate a surface acoustic wave having an operating wavelength ($\lambda$) along the piezoelectric layer, the IDT electrodes being formed from the substantially 2D conductive material;
    wherein the equipotential layer defines an electrically short-circuited surface coupled between the second surface of the piezoelectric layer and a first surface of the high acoustic velocity layer.

2. The surface acoustic wave device according to claim 1, further comprising at least one adhesive layer coupled between the piezoelectric layer and the equipotential layer and/or between the equipotential layer and the high acoustic velocity layer.

3. The surface acoustic wave device of claim 1, wherein the substantially 2D conductive material is one of monolayer graphene, few-layer graphene, monolayer borophene, and few-layer borophene.

4. The surface acoustic wave device of claim 1, wherein a thickness of the equipotential layer is approximately $0.0034\lambda$.

5. The surface acoustic wave device of claim 1, wherein the piezoelectric layer comprises lithium niobate (LN) or lithium tantalite (LT).

6. The surface acoustic wave device of claim 1, wherein the piezoelectric layer has a cut angle of any one of Euler angles (30°+/−15°, 90°+/−30°,)60°+/−30°, (90°+/−15°, 90°+/−30°,)120°+/−30°, and (150°+/−15°, 90°+/−30°,) 60°+/−30°.

7. The surface acoustic wave device of claim 1, wherein the piezoelectric layer is of a cut angle whereby the surface acoustic wave is substantially propagated as a Sezawa wave.

8. The surface acoustic wave device according to claim 1, wherein the surface acoustic wave is a substantially a pure surface wave with minimal bulk components.

9. The surface acoustic wave device of claim 1, wherein a thickness of the IDT electrodes is approximately between $0.001\lambda$ and $0.01\lambda$.

10. The surface acoustic wave device of claim 9, wherein the thickness of the IDT electrodes is approximately $0.0034\lambda$.

11. The surface acoustic wave device according to claim 1, wherein a thickness of the piezoelectric layer is less than $\lambda$.

12. The surface acoustic wave device according to claim 11, wherein the thickness of the piezoelectric layer is approximately $0.1\lambda$.

13. The surface acoustic wave device according to claim 1, wherein the high acoustic velocity layer is of a thickness such that the high acoustic velocity layer appears infinite or semi-infinite to the surface acoustic wave.

14. The surface acoustic wave device according to claim 1, wherein the high acoustic velocity layer is formed from diamond.

15. The surface acoustic wave device according to claim 14, wherein a thickness of the high acoustic velocity layer is approximately $0.8\lambda$.

16. The surface acoustic wave device according to claim 1, wherein the high acoustic velocity layer has an acoustic velocity between approximately 8,000 m/s and approximately 10,000 m/s.

17. A method of manufacturing a surface acoustic wave (SAW) device, the method comprising:
providing a base layer;
providing a high acoustic velocity layer over the base layer;
providing an equipotential layer of a substantially two-dimensional (2D) conductive material over the high acoustic velocity layer;
providing a piezoelectric layer over the equipotential layer, the piezoelectric layer formed from a single crystal material; and
providing at least one transducer of the substantially 2D conductive material over the piezoelectric layer, the transducer comprising a plurality of interdigital transducer (IDT) electrodes configured to propagate a surface acoustic wave having an operating wavelength ($\lambda$) along the piezoelectric layer.

18. The method claim 17, wherein the piezoelectric layer is provided by bonding the piezoelectric layer over the equipotential layer using piezoelectric-on-insulator (POI) process.

19. A surface acoustic wave device comprising:
a base layer;
a high acoustic velocity layer directly formed on the base layer;
a piezoelectric layer directly formed on the high acoustic velocity layer, the piezoelectric layer formed from a single crystal material and having a first surface and an opposing second surface; and
at least one transducer directly formed on the first surface of the piezoelectric layer, wherein the at least one transducer comprises a plurality of interdigital transducer (IDT) electrodes configured to propagate a surface acoustic wave having an operating wavelength ($\lambda$) along the piezoelectric layer, wherein the piezoelectric layer is of a cut angle whereby the surface acoustic wave is substantially propagated as a Sezawa wave;
wherein no intermediate layer is provided between the piezoelectric layer and the high acoustic velocity layer, the interface between the piezoelectric layer and the high acoustic velocity layer providing an electrically open surface.

20. A method of manufacturing a surface acoustic wave (SAW) device, the method comprising:
providing a base layer;
forming a high acoustic velocity layer directly on the base layer;
forming a piezoelectric layer directly on the high acoustic velocity layer, the piezoelectric layer formed from a single crystal material; and
forming at least one transducer of a substantially two-dimensional (2D) conductive material directly on the piezoelectric layer, the transducer comprising a plurality of interdigital transducer (IDT) electrodes configured to propagate a surface acoustic wave having an operating wavelength ($\lambda$) along the piezoelectric layer, wherein the piezoelectric layer is of a cut angle whereby the surface acoustic wave is substantially propagated as a Sezawa wave;
wherein no intermediate layer is provided between the piezoelectric layer and the high acoustic velocity, the interface between the piezoelectric layer and the high acoustic velocity layer providing an electrically open surface.

* * * * *